United States Patent
Iino et al.

(10) Patent No.: US 7,750,417 B2
(45) Date of Patent: Jul. 6, 2010

(54) NON-VOLATILE SEMICONDUCTOR MEMORY AND METHOD FOR FABRICATING A NON-VOLATILE SEMICONDUCTOR MEMORY

(75) Inventors: Naohisa Iino, Kanagawa (JP); Yasuhiko Matsunaga, Kanagawa (JP); Fumitaka Arai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 281 days.

(21) Appl. No.: 11/832,459

(22) Filed: Aug. 1, 2007

(65) Prior Publication Data
US 2008/0169497 A1    Jul. 17, 2008

Related U.S. Application Data

(62) Division of application No. 11/103,612, filed on Apr. 12, 2005, now abandoned.

(30) Foreign Application Priority Data
Sep. 6, 2004 (JP) ............................. 2004-258523

(51) Int. Cl.
H01L 27/088 (2006.01)
H01L 27/112 (2006.01)
(52) U.S. Cl. ................ 257/392; 257/390; 257/E27.061
(58) Field of Classification Search ............. 257/69, 257/74, 205, 348, 402, 404, 607, 392, E27.061
See application file for complete search history.

(56) References Cited

U.S. PATENT DOCUMENTS

| 5,691,552 A | * | 11/1997 | Oyama | 257/316 |
| 5,698,879 A | * | 12/1997 | Aritome et al. | 257/315 |
| 5,814,854 A | | 9/1998 | Liu et al. | |
| 6,115,287 A | | 9/2000 | Shimizu et al. | |
| 6,222,224 B1 | * | 4/2001 | Shigyo | 257/315 |
| 6,617,651 B2 | | 9/2003 | Ohsawa | |
| 2004/0166621 A1 | | 8/2004 | Forbes | |

FOREIGN PATENT DOCUMENTS

| JP | 8-204035 | 8/1996 |
| JP | 10-294389 | 11/1998 |
| JP | 11-163303 | 6/1999 |
| JP | 2000-353790 | 12/2000 |

OTHER PUBLICATIONS

Loncar, B. et al., "One of Application of SOI Memory Cell—Memory Array", International Conference On Microelectronics, vol. 2, May 2000, http://ieeexplore.ieee.org/iel5/6768/18084/00838731.pdf?arnumber=838731.
U.S. Appl. No. 12/142,274, filed Jun. 19, 2008, Watanabe et al.
U.S. Appl. No. 12/564,349, filed Sep. 22, 2009, Mizukami, et al.

* cited by examiner

*Primary Examiner*—David Vu
*Assistant Examiner*—Earl N Taylor
(74) *Attorney, Agent, or Firm*—Oblon, Spivak, McClelland, Maier & Neustadt, L.L.P.

(57) ABSTRACT

A non-volatile semiconductor memory includes memory cell transistors arranged in a matrix, wherein each of the memory cell transistors is a depletion mode MIS transistor.

16 Claims, 38 Drawing Sheets

| LINE \ STATE | PROGRAM | ERASE | READ |
|---|---|---|---|
| SL | Vcc | Vera | 0V |
| SGS | 0V | Vsgs | Vcc |
| WL1 | Vpgm | 0V | 0V |
| WL2~WLn | Vpass | 0V | Vread |
| SGD | Vcc | Vsgd | Vcc |
| BL1 | Vcc | Vera | Vbl |
| BL2~BLm | 0V | Vera | Vbl |

NON-VOLATILE SEMICONDUCTOR MEMORY AND METHOD FOR FABRICATING A NON-VOLATILE SEMICONDUCTOR MEMORY

CROSS REFERENCE TO RELATED APPLICATIONS AND INCORPORATION BY REFERENCE

This application is a divisional of and claims the benefit of priority under 35 USC §120 from U.S. Ser. No. 11/103,612, filed Apr. 12, 2005 and is based upon and claims the benefit of priority under 35 USC §119 from the Japanese Patent Application No. P2004-258523, filed on Sep. 6, 2004, the entire contents of both of which are incorporated herein by reference.

BACKGROUND OF THE INVENTION

1. Field of the Invention

This present invention relates to a non-volatile semiconductor memory, more particularly, a non-volatile semiconductor memory and a method for fabricating the same using Silicon On Insulator (SOI) technique.

2. Description of the Related Art

An electrically erasable programmable read-only memory (EEPROM) is known as a non-volatile semiconductor memory. In the EEPROM, a cell array is comprised in such a way that a memory cell transistor is arranged at an intersection where a word line in the row direction and a bit line in the column direction cross over each other. Among EEPROMs, the NAND flash EEPROM in which a plurality of memory cell transistors are connected in series, and which can erase all the written data simultaneously, has been in wide use.

A memory cell transistor of the NAND flash EEPROM includes $n^+$-source and drain regions which are opposite to each other; and a p channel region between the source and drain regions. A stacked gate structure is formed on the channel region in which a control gate electrode and a floating gate electrode are stacked. Memory cell transistors adjacent to one another in the row direction are isolated from one another by an element isolation region. The NAND flash EEPROM experiences of fluctuations in gate threshold voltage due to influence of parasitic capacitance in the element isolation region between memory cell transistors and parasitic capacitance between an interconnect and a substrate, and the like.

In order to reduce the fluctuation in the gate threshold voltage due to the influence of the parasitic capacitance in the element isolation region and the parasitic capacitance between the interconnect and the substrate, a NAND flash EEPROM has been considered which employs SOI technology in which a semiconductor layer (SOI layer), arranged on the an embedded insulating layer (SOI insulator), serves as an active layer. According to the NAND flash EEPROM employing the SOI technology, the memory cell transistors adjacent to one another in the row direction are isolated from one another by the element isolation insulating film which is embedded as far as the SOI insulator, thereby enabling the parasitic capacitance in the element isolation region be reduced. In addition, since the SOI layer is formed on the SOI insulator, the parasitic capacitance between the interconnect and the substrate can be reduced, and hence the fluctuation in the gate threshold voltage can be reduced. As the memory cell transistor has been minaturized, an interval between the source and the drain of the memory cell transistor has become so narrower that influence of the short channel effect has increased in the NAND flash EEPROM employing the SOI technology.

SUMMARY OF THE INVENTION

An aspect of the present invention inheres in a non-volatile semiconductor memory comprising memory cell transistors arranged in a matrix, wherein each of the memory cell transistors is a depletion mode MIS transistor.

Another aspect of the present invention inheres in a non-volatile semiconductor memory having a plurality of memory cell transistors arranged in a matrix, wherein each of the memory cell transistors is a depletion mode MIS transistor including: source and drain regions having a first conductivity type disposed on an insulating layer; a channel region having the first conductivity type disposed between the source and drain regions, and having a lower impurity concentration than the source and drain regions; a floating gate electrode disposed above the channel region and insulated from the channel region; and a control gate electrode disposed above the floating gate electrode and insulated from the floating electrode.

Further aspect of the present invention inheres in a method for fabricating a non-volatile semiconductor memory comprising, forming a depletion mode memory cell transistor, comprising: depositing a gate insulating film on a semiconductor layer having a first conductivity type disposed on an insulating layer; depositing a floating gate electrode on the gate insulating film; depositing an inter-electrode insulating film on the floating gate electrode; depositing a control gate electrode on the inter-electrode insulating film; forming a groove penetrating the control gate electrode, the inter-electrode insulating film and the floating gate electrode; and forming source and drain regions having the first conductivity type in the semiconductor layer under the groove.

DETAILED DESCRIPTION OF THE INVENTION

Figure 1:
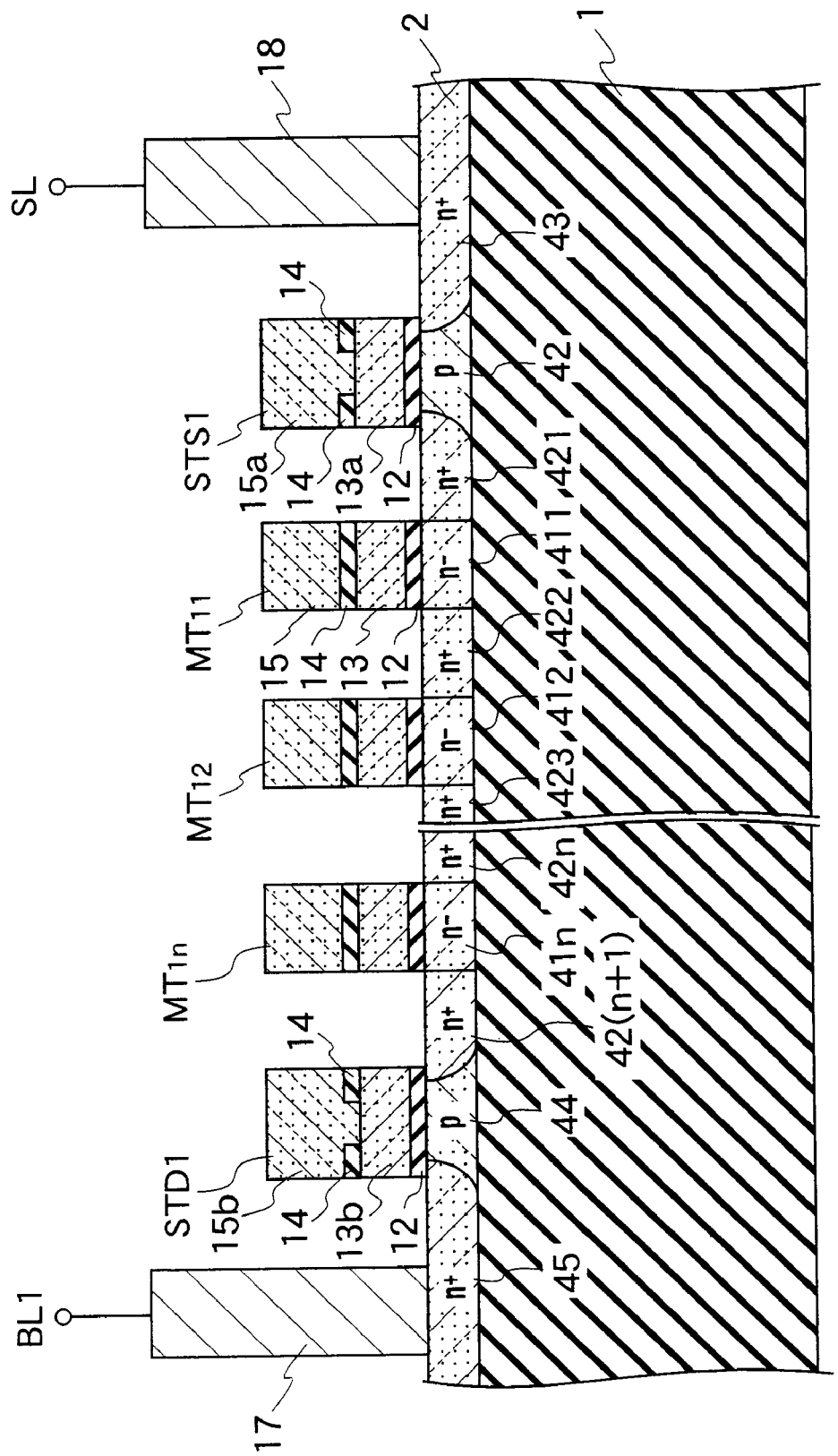
FIG. 1 is a cross-sectional view in the column direction (I-I direction of FIG. 2) showing an example of a cell array of a non-volatile semiconductor memory according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

Figure 2:
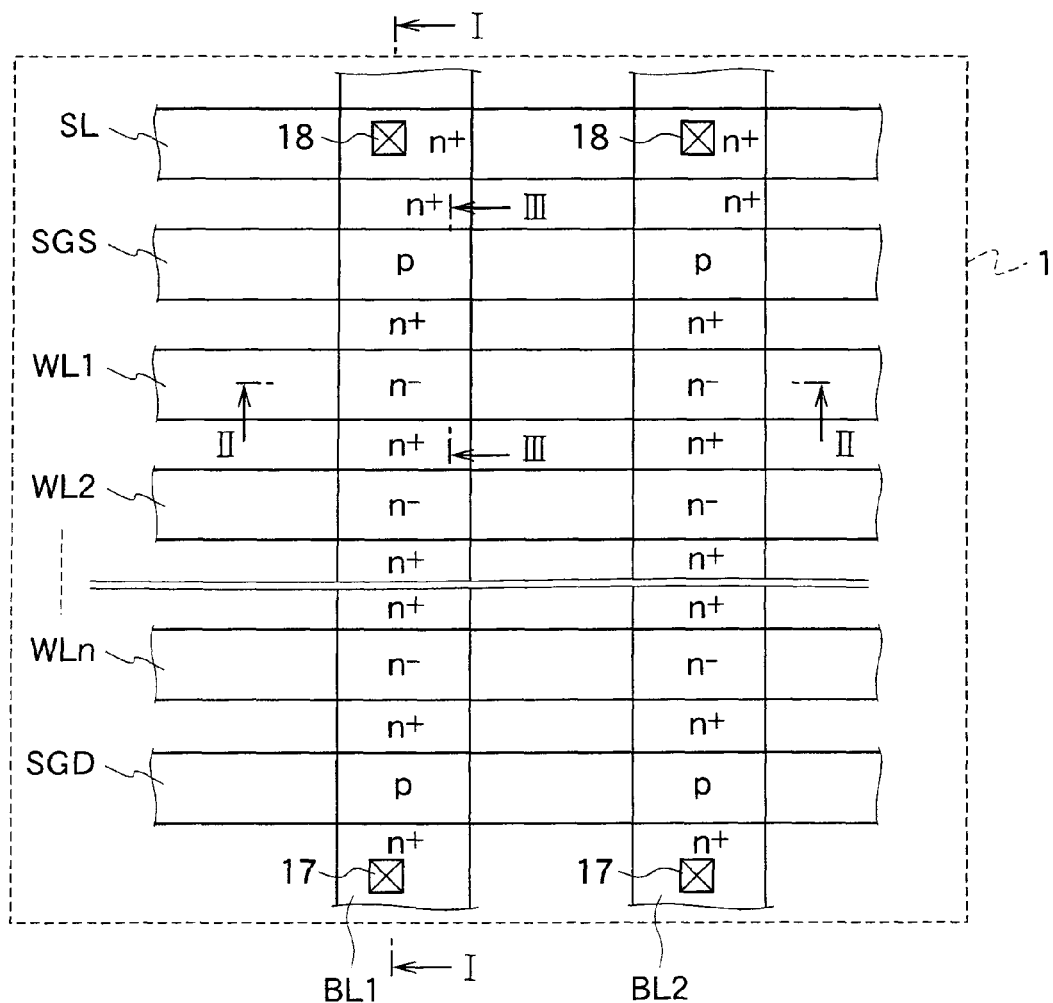
FIG. 2 is a plan view showing an example of the cell array of the non-volatile semiconductor memory according to the embodiment of the present invention.

A non-volatile semiconductor memory according to an embodiment of the present invention is an insulating film (SOI insulator) and an NAND flash EEPROM in which a plurality of memory cell transistors are arranged in a matrix on the SOI insulator. FIG. 1 is a cross-sectional view of the non-volatile semiconductor memory taken along the I-I line in the column direction as shown in FIG. 2. As shown in FIG. 1, the memory cell transistors $MT_{11}$ to $MT_{1n}$ are depletion mode MIS transistors including source and drain regions $42_1$ to $42(n+1)$ having a first conductivity ($n^+$) type. The memory cell transistors $MT_{11}$ to $MT_{1n}$ are arranged on the SOI insulator 1, and are opposite to each other. Channel regions $41_1$ to $41_n$ having a first conductivity ($n^-$) type are interposed between each adjacent pair of the source and drain regions $42_1$ to $42(n+1)$. The impurity concentrations of the channel regions $41_1$ to $41_n$ are lower than that of the source and drain regions $42_1$ to $42(n+1)$. Floating gate electrodes 13 are insulated, and each is arranged above each of the channel regions $41_1$ to $41_n$. Control gate electrodes 15 are insulated, and each is arranged above each of the floating gate electrodes 13.

The memory cell transistors $MT_{11}$ to $MT_{1n}$ include the channel regions $41_1$ to $41_n$ having a conductivity which is the same as that of the source and drain regions $42_1$ to $42(n+1)$, thereby constituting the depletion mode MIS transistors. The "MIS transistor" is an insulated gate transistor, such as a field effect transistor (FET) and a static induction transistor (SIT), which controls channel current by gate voltage through an insulating film (gate insulating film) interposed between a gate electrode and a channel region. A MISFET in which a silicon oxide film ($SiO_2$ film) is used as a gate insulating film is referred to as a metal oxide semiconductor field effect transistor (MOSFET). In addition $SiO_2$, silicon nitride ($Si_3N_4$), tantalum oxide ($Ta_2O_5$), titanium oxide ($TiO_2$), alumina ($Al_2O_3$), zirconium oxide ($ZrO_2$) and the like can be used as a material for the gate insulating film of the MIS transistor.

In FIG. 1, for example, n (n is an integer) memory cell transistors $MT_{11}$ to $MT_{1n}$ are arranged in the column direction so that they are adjacent to one another. Each of the memory cell transistors $MT_{11}$ to $MT_{1n}$ is a depletion mode MIS transistor including: the source and drain regions $42_1$ to $42(n+1)$, each of which is common to each adjacent pair of the memory cell transistors $MT_{11}$ to $MT_{1n}$; floating gate electrodes 13, each of which is arranged above one of the channel regions 411 to 41n interposed between each adjacent pair of the source and drain regions 421 to 42(n+1) with a gate insulating film (tunnel oxide film) 12 interposed between the floating gate electrode and the channel region; and control gate electrodes 15, each of which is arranged above each of the floating gate electrodes 13 with an inter-electrode insulating film 14 interposed between the control gate electrode and the floating gate electrode. Each of the memory cell transistors $MT_{11}$ to $MT_{1n}$ is a depletion mode MIS transistor implemented by a stacked gate structure in which the floating gate electrodes 13 and the control gate electrodes 15 are stacked. $Si_3N_4$, $Ta_2O_5$, $TiO_2$, $Al_2O_3$, $ZrO_2$, oxide/nitride/oxide (ONO), phosphor silicate glass (PSG), boron phosphor silicate glass (BPSG), silicon oxide nitride (SiON), barium titanate ($BaTiO_3$), silicon oxide fluoride ($SiO_xF_x$), and organic resins such as polyimide can be used as materials for the inter-electrode insulating film 14.

$SiO_2$, sapphire ($Al_2O_3$) and the like can be used as materials of the SOI insulator 1 with which an SOI structure is provided. Single crystal silicon, silicon germanium (SiGe) and the like can be used as a material for an semiconductor layer (SOI layer) 2 provided on the top of the SOI insulating film 1. The $n^-$ channel regions 411 to 41n and the $n^+$-source and drain regions 421 to 42(n+1) are arranged in the SOI insulating layer 2. Each of the source regions 421 to 42n, each of the channel regions 411 to 41n and each of the drain regions 422 to 42(n+1) are arranged alternately in one column direction so that, out of the plurality of memory cell transistors $MT_{11}$ to $MT_{1n}$ arranged in the column direction in the matrix, the drain region 422 of one memory cell transistor $MT_{11}$ serves as the source region 422 of another memory cell transistor $MT_{12}$, adjacent to the memory cell transistor $MT_{11}$. The memory cell transistors $MT_{11}$ to $MT_{mn}$ are arranged in a plurality of parallel columns so that the source regions 421 to 42n, the channel regions 411 to 41n and the drain regions 422 to 42(n+1) are isolated from the corresponding source regions, channel regions and drain regions in other columns.

Each of two select gate transistors STS1 and STD1 is arranged in, and adjacent to, each end of the column direction of the memory cell transistors $MT_{11}$ to $MT_{1n}$. The select gate transistor STS1 is an enhancement MIS transistor including: an $n^+$ drain region 421 which is common a source region 421 of the memory cell transistor MT 11 positioned in one end of the arrangement in the column direction; a channel region 42 having a second conductivity (p) type arranged so as to be adjacent to the drain region 421; an $n^+$ source region 43 arranged so as to be adjacent to the channel region 42; select gate electrodes 13a and 15a arranged above the channel region 42 with the gate insulating film 12 interposed between the channel region 42 and the set of select gate electrodes 13a and 15a. The drain region 421, the channel region 42 and the source region 43 are arranged in the SOI layer 2. A source line contact 18 is arranged on the source region 43 so that the source line contact 18 is adjacent to the select gate transistor STS1.

Alternatively, the select gate transistor STD1 is an enhancement MIS transistor including: an $n^+$ source region 42(n+1) which is common a drain region 42(n+1) of the memory cell transistor MT in positioned in another end of the arrangement in the column direction; a channel region 44 having a second conductivity type (p) arranged so as to be adjacent to the source region 42(n+1); an $n^+$ drain region 45 arranged so as to be adjacent to the channel region 44; select gate electrodes 13b and 15b arranged above the channel region 44 with the gate insulating film 12 interposed between the channel region 44 and the set of select gate electrodes 13b and 15b. The source region 42(n+1), the channel region 44 and the drain region 45 are arranged in the SOI layer 2. A bit line contact 17 is arranged on the drain region 45 so that the bit line contact 17 is adjacent to the select gate transistor STD1.

As shown in FIG. 2, the following are arranged in the column direction of a cell array in the non-volatile semiconductor memory according to the present embodiment: a source line SL connected to the source line contact 18; a select gate line SGS to which the select gate electrodes 13a and 15a of a select gate transistor STS1 are connected; word lines WL1 to WLn to which the control gate electrodes 15 of the respective memory cell transistors $MT_{11}$ to $MT_{11}$ are connected; and a select gate line SGD to which the select gate electrodes 13b and 15b of the select gate transistor STD1 are connected. Bit lines BL1 and BL2 connected to the bit line contact 17 are arranged in the row direction.

Figure 3:
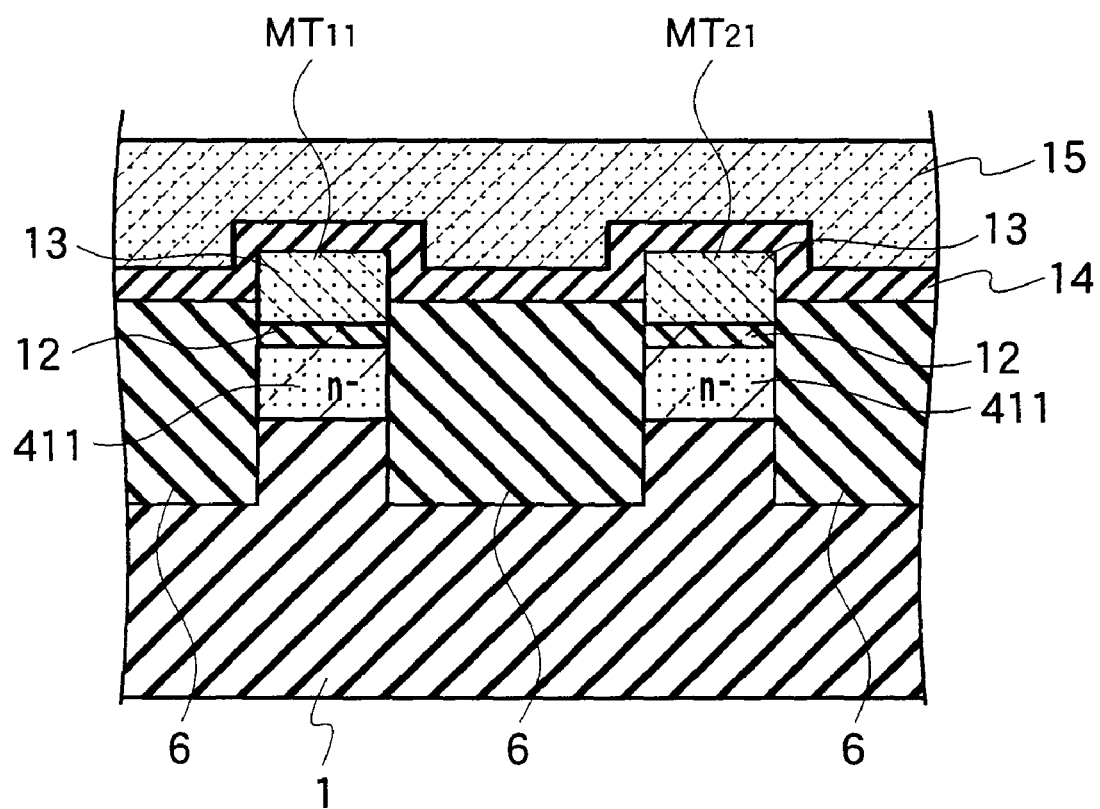
FIG. 3 is a cross-sectional view in the row direction (II-II direction of FIG. 2) showing an example of the cell array of the non-volatile semiconductor memory according to the embodiment of the present invention.

FIG. 3 is a cross-sectional view of the non-volatile semiconductor memory taken along the II-II line in the row direction shown in FIG. 2. As shown in FIG. 3, an element isolation insulating film 6 is embedded between the floating gate electrode 13 and the channel region 411 of each of the memory cell transistors $MT_{11}$ and $MT_{21}$ which are adjacent to one another in the row direction. Elements of the respective memory cell transistors $MT_{11}$ and $MT_{21}$, which are adjacent to one another in the row direction, are completely isolated from one another. A peripheral circuit of a cell array arranged on a semiconductor substrate is further provided in the outside of the cell array comprised of a plurality of memory cell transistors.

Figure 4:
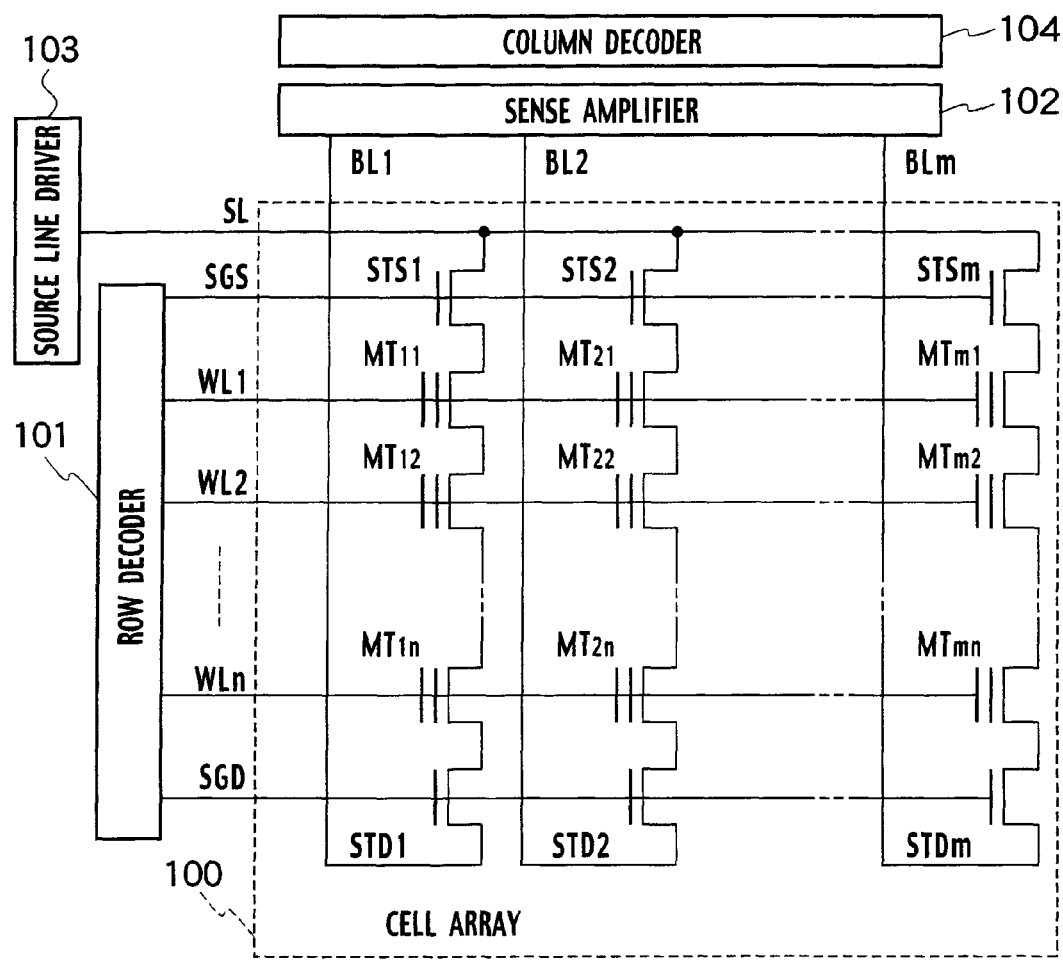
FIG. 4 is an equivalent circuit diagram showing an example of the cell array of the non-volatile semiconductor memory according to the embodiment of the present invention.

An equivalent circuit of the non-volatile semiconductor memory according to the embodiment shown in FIGS. 1 to 3 is shown in FIG. 4. As shown in FIG. 4, a cell array 100 comprises m×n (m and n are integers) memory cell transistors $MT_{11}$ to $MT_{1n}$, $MT_{21}$ to $MT_{2n}$, ..., $MT_{11}$ to $MT_{mn}$ which are depletion mode MIS transistors. In the cell array 100, a plurality of memory cell transistors $MT_{11}$ to $MT_{11}$ are arranged as a group in a column; a plurality of memory cell transistors $MT_{21}$ to $MT_{2n}$ are arranged as a group in another column; ...; and a plurality of memory cell transistors $MT_{m1}$ to $MT_{mn}$ are arranged as a group in the other column. In addition, the group of memory cell transistors $MT_{11}$ to $MT_{1n}$, the group of memory cell transistors $MT_{21}$ to $MT_{2n}$, ..., and the group of memory cell transistors $MT_{m1}$ to $MT_{mn}$ are arranged in the row direction. In this way, the plurality of memory cell transistors $MT_{11}$ to $MT_{1n}$, $MT_{21}$ to $MT_{2n}$, $MT_{m1}$ to $MT_{11}$ are arranged in a matrix.

In a cell array 100, the memory cell transistors MT11 to MT1n, the select gate transistors STS1 and STD1 are connected in series, thereby comprising a cell unit. The drain region of the enhancement mode select gate transistor STS1 which selects one out of the memory cell transistors $MT_{11}$ to $MT_{11}$ is connected to the source region of the memory cell transistor $MT_{11}$ positioned at one end of the arrangement in which the group of memory cell transistors $MT_{11}$ to $MT_{1n}$ are connected in series. The source region of the enhancement selective gate transistor STD1 which selects one out of the memory cell transistors $MT_{11}$ to $MT_{1n}$ is connected to the drain region of the memory cell transistor $MT_{11}$ positioned at the other end of the arrangement in which the group of memory cell transistors $MT_{11}$ to $MT_{1n}$ are connected in series. The select gate transistor STS2, the memory cell transistors $MT_{21}$ to $MT_{2n}$ and the select gate transistor STD2 are also connected in series, thereby comprising a cell unit; ...; the select gate transistor STSm, the memory cell transistors $MT_{m1}$ to $MT_{mn}$ and the select gate transistor STDm are also connected in series, thereby comprising a cell unit.

The source regions of the respective select gate transistors STS1 to STSm are connected with a source line SL common the source regions. A source line driver 103 which supplies voltage to the source line SL is connected to the source line SL. The following are connected to a row decoder 101: a select gate line SGS common the select gate transistors STS1 to STSm; a select gate line SGD common the select gate transistors STD1 to STDm; a word line WL1 common the memory cell transistors $MT_{11}, MT_{21}, \ldots, MT_{m1}$; a word line WL2 common the memory cell transistors $MT_{12}, MT_{22}, MT_{m2}; \ldots$; and a word line WLn common the memory cell transistors $MT_{1n}, MT_{2n}, \ldots$, MTmn. The row decoder 101 obtains a row address decoded signal by decoding a row address signal, and supplies operation voltage to the word lines WL1 to WLm and the select gate lines SGS and SGD in a selective manner. Each of bit lines BL1 to BLm is connected to the drain region of each of the select gate transistors STD1 to STDm. A sense amplifier 102 and a column decoder 104 are connected to the bit lines BL1 to BLm. The column decoder 104 obtains a column address decoded signal by decoding a column address signal, and selects one out of the bit lines BL1 to BLm based on the column address decoded signal. The sense amplifier 102 amplifies data which has been read from a memory cell transistor selected by the row decoder 101 and the column decoder 104.

Figures 5, 6:
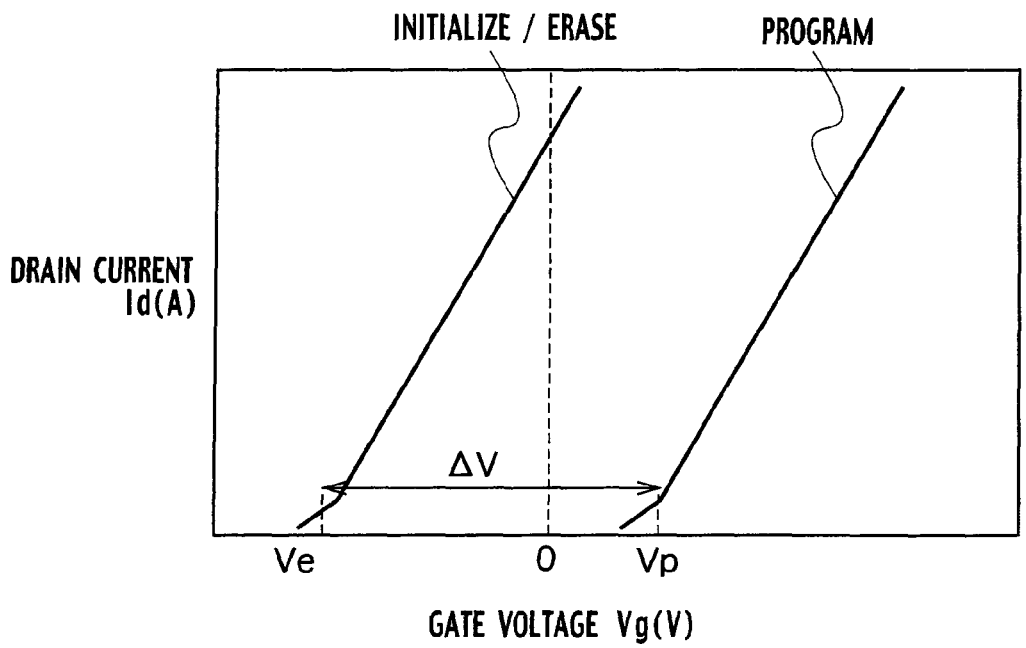
FIG. 5 is a graph showing an example of I-V characteristic of a memory cell transistor of the non-volatile semiconductor memory according to the embodiment of the present invention.
FIG. 6 is a chart showing an example of operation voltage supplying to a wiring of the cell array of the non-volatile semiconductor memory according to the embodiment of the present invention.
Figure 7:
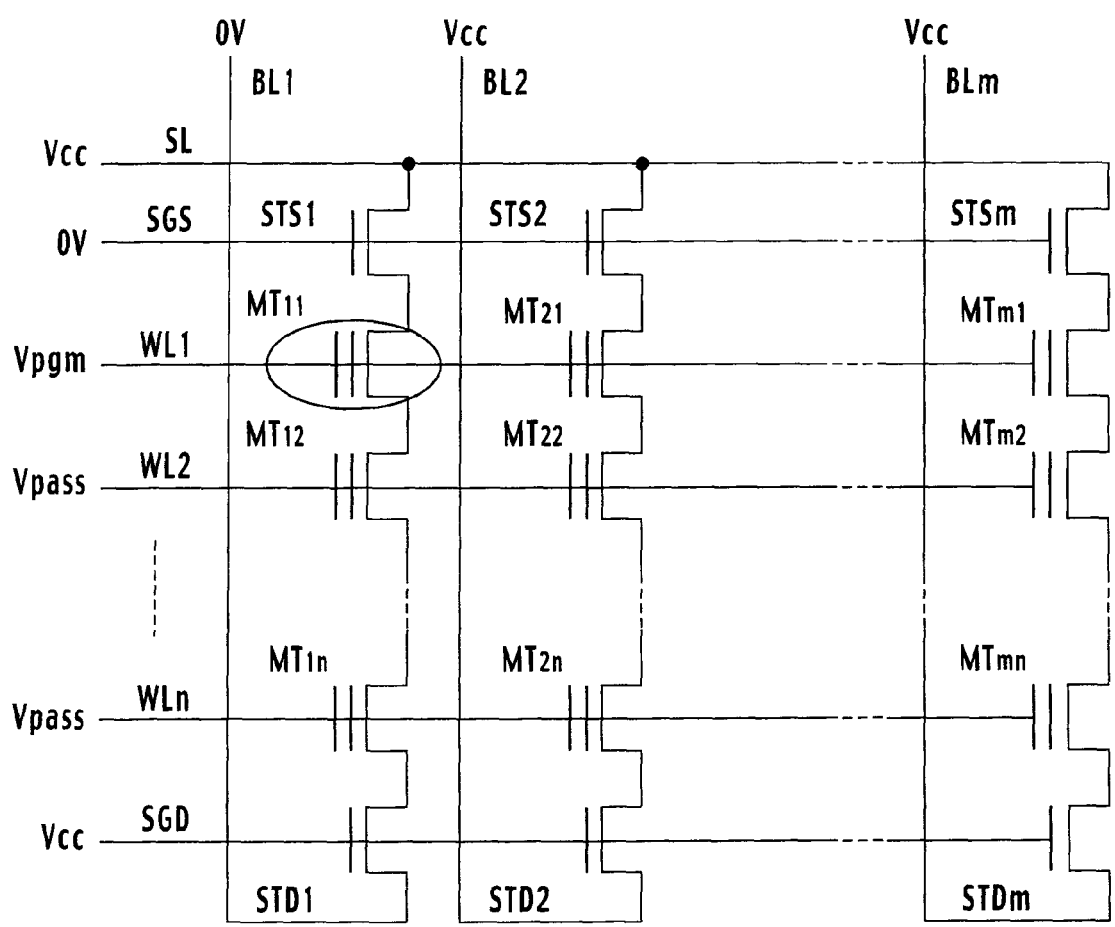
FIG. 7 is an equivalent circuit diagram for explaining writing operation of the non-volatile semiconductor memory according to the embodiment of the present invention.

Next, a description will be provided for operations of writing, erasing and reading performed by the non-volatile semiconductor memory according to the embodiment of the present invention. In an initial state (data is 1) where the memory cell transistor $MT_{11}$ shown in FIG. 1 has not accumulated electrons in its floating gate electrode 13, a threshold voltage of the memory cell transistor $MT_{11}$ is a negative threshold voltage Ve as shown in FIG. 5, since the memory cell transistor $MT_{11}$ is a depletion mode memory cell transistor. To begin with, a description will be provided for an example of a writing operation with reference to FIGS. 6 and 7. Hereinafter, it is assumed that the memory cell transistor $MT_{11}$ is selected during its writing and reading operations. The memory cell transistor $MT_{11}$ which has been selected is referred to as a "selected memory cell transistor," and the memory cell transistors $MT_{12}$ to $MT_{1n}$, $MT_{21}$ to $MT_{2n}, \ldots$, and $MT_{m1}$ to $MT_{mn}$ which have not been selected are referred to as "non-selected memory cell transistors." The bit line BL1 and the word line WL1 connected to the selected memory cell transistor $MT_{11}$ are referred to as a "selected bit line" and a "selected word line" respectively. The bit lines BL2 to BLm and the word lines WL2 to WLn connected only to the non-selected memory cell transistors MT21 to MT $2n, \ldots$, MTm1 and MTmn are referred to as "non-selected bit lines" and "non-selected word lines."

A voltage of 0 V and a power supply voltage Vcc (for example, 3V) are applied to the selected bit line BL1 and the source line SL respectively. A voltage of 0 V is applied to the select gate line SGS, thus causing the select gate transistor STS1 to be in the "off" state, thus causing the source line SL to be in the "cut-off" state. The power supply voltage Vcc (for example, 3 V) is applied to the select gate line SGD, and the select gate transistor STD1 is caused to be in the "on" state, accordingly causing 0 V in the selected bit line BL1 to be transmitted to the selected memory cell transistor $MT_{1n}$.

A write voltage $V_{pgm}$ (for example, 20 V) is applied to the selected word line WL1. An intermediate potential $V_{pass1}$ (for example, 10 V) is applied to each of the non-selected word lines WL2 to WLm. The selected memory cell transistor $MT_{11}$ and the non-selected memory cell transistors $MT_{12}$ to $MT_{1n}$ are all caused to be in the "on" state, thus causing 0 V in the selected bit line BL1 to be transmitted.

In the selected memory cell transistor $MT_{11}$, the write voltage $V_{pgm}$ (for example, 20 V) is applied to the control gate electrode 15 shown in FIG. 1, and a high electric field is applied between the channel region 411 underneath the floating gate electrode 13 to which 0 V is transmitted from the selected bit line BL1 and the floating gate electrode 13, thus injecting electrons into the floating gate electrode 13 through the gate insulating film 12. Once electrons have been accumulated in floating gate electrode 13, a threshold voltage of the selected memory cell transistor $MT_{11}$ increases by $\Delta V$ from the negative threshold voltage Ve to a positive threshold voltage Vp, and accordingly the selected memory cell transistor $MT_{11}$ is in the "write" state (data is 0).

For example, the power supply voltage Vcc (for instance, 3 V) is applied to each of the non-selected bit lines BL2 to BLm. A voltage of 0 V is applied to the select gate line SGS, and thus each of the select gate transistors STS2 to STSm is in the "off" state, accordingly causing the source line SL to be in the "cut-off" state. The power supply voltage Vcc (for example, 3 V) is applied to the select gate line SGD, thus causing each of the selected gate transistors STD2 to STDm to be in the "on" state. Accordingly, voltages (for example, 3 V–Vth V), which are obtained by subtracting the threshold voltage Vth in the select gate transistors STD2 to STDm from the power supply voltages Vcc in the non-selected bit lines BL2 to BLm respectively, to be transmitted to the non-selected memory cell transistors $MT_{21}$ to $MT_{2n}, \ldots, MT_{m1}$ to $MT_{11}$ Since the select gate line SGS is in the "cut-off" state, electric potential differences between each of the select gate transistors STD2 to STDm and each of the source regions of the respective non-selected memory cell transistors, to which the aforementioned voltages are transmitted, are caused to be (Vcc)–(Vcc–Vth)=Vth V. Consequently, the select gate transistors SGD2 to SGDm are also in the "cut-off" state.

When the select gate transistors SGD2 to SGDm and the select gate transistors SGS2 to SGSm are cut off, the channel regions underneath the respective non-selected memory cell transistors $MT_{21}$ to $MT_{2n}, \ldots, MT_{m1}$ to $MT_{mn}$ are in the "on" state, and the channel regions from the source line SL and the bit lines BL2 to BLm are in the "floating" state. Potentials of channel regions which have been in the "floating" state are increased (larger than, or equal to, Vcc and smaller than, equal to, Vpass, for example 7 to 8 V) by the coupling of the potentials Vpgm and Vpass.

Since channel potentials of the non-selected memory cell transistors $MT_{21}$ to $MT_{2n}, \ldots, MT_{11}$ to $MT_{mn}$ are increased, even if the write voltage Vpgm (for example, 20V) is applied to the non-selected memory cell transistors $MT_{21}$ to $MT_{2n}, \ldots, MT_{m1}$ to $MT_{mn}$, differences in potential between each of the non-selected memory cell transistors MT21 to MTm1 and each of the corresponding floating gate electrodes 13 are small. Accordingly, electrons are not injected into the floating gate electrodes 13.

Figure 8:
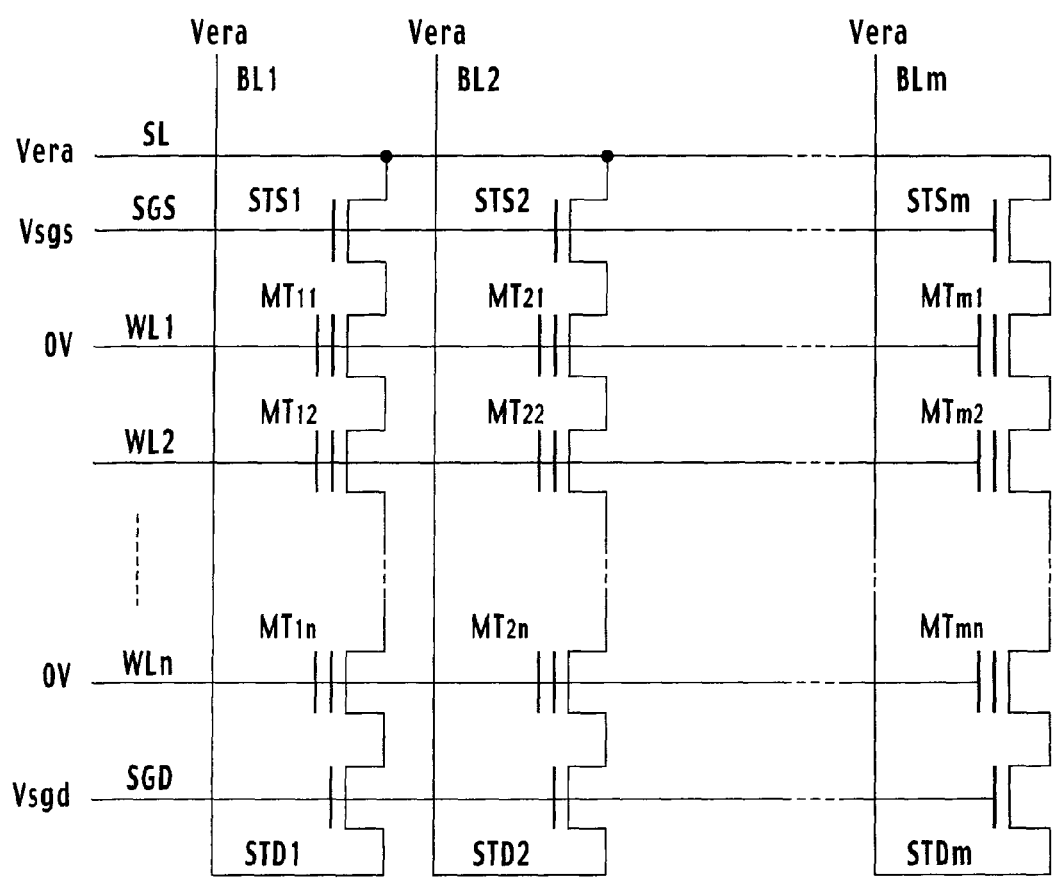
FIG. 8 is an equivalent circuit diagram for explaining erasing operation of the non-volatile semiconductor memory according to the embodiment of the present invention.

Next, a description will be provided for an example of the erasing operation with reference to FIGS. 6 and 8. In the NAND flash EEPROM, data can be erased simultaneously from all the memory cell transistors in a selected block. Here, a description will be provided for an example of a simultaneous erasure of all the written data from the memory cell transistors $MT_{11}$ to $MT_1$, $MT_{21}$ to $MT_{2n}, \ldots, MT_{m1}$ to $MT_{mn}$ in the cell array 100.

An erase voltage Vera (for example, 20 V) is applied to all the bit lines BL1 to BLm and the source line SL, respectively. An initial voltage Vsgd (for example, 4 V) is applied to the select gate line SGD, so that the select gate transistor STD1 is in the "on" state. Accordingly, the erase voltage Vera (for example, 20 V) in the bit line BL1 to BLm is transmitted to the memory cell transistors $MT_{1n}$, $MT_{2n}$, ..., $MT_{mn}$. An initial voltage Vsgs (for example, 4 V) is applied to the select gate line SGS, so that the select gate transistor STS1 is in an "on" state. Accordingly, the erase voltage Vera (for example, 20 V) in the source line SL is transmitted to the memory cell transistors $MT_{11}$, $MT_{21}$, ..., $MT_{m1}$.

A voltage of 0 V is applied to all the word lines WL1 to WLn. Since the memory cell transistors $MT_{11}$ to $MT_{1n}$, $MT_{21}$ to $MT_{2n}$, ..., $MT_{m1}$ to $MT_{mn}$ are depletion mode memory cell transistors, the memory cell transistors $MT_{11}$ to $MT_{1n}$, $MT_{21}$ to $MT_{2n}$, ..., $MT_{m1}$ to $MT_{mn}$ are in the "on" state if 0 V is applied to the control gate electrodes 15. When the erase voltage Vera (for example, 20 V) is applied to the SOI layer 2, electrons are emitted from the floating gate electrodes 13 to the channel regions through the gate insulating film 12. Once the electrons are emitted from the floating gate electrodes 13, the threshold voltage of the selected memory cell transistor $MT_{11}$ is decreased by $\Delta V$ from a positive threshold voltage Vp to a negative threshold voltage Ve as shown in FIG. 5. Thus, the selected memory cell transistor $MT_{11}$ will in the "erase" state (date is 1). Consequently, data are erased simultaneously from the memory cell transistors $MT_{11}$ to $MT_{1n}$, $MT_{21}$ to $MT_{2n}$, ..., $MT_{m1}$ to $MT_{mn}$.

Figure 9:
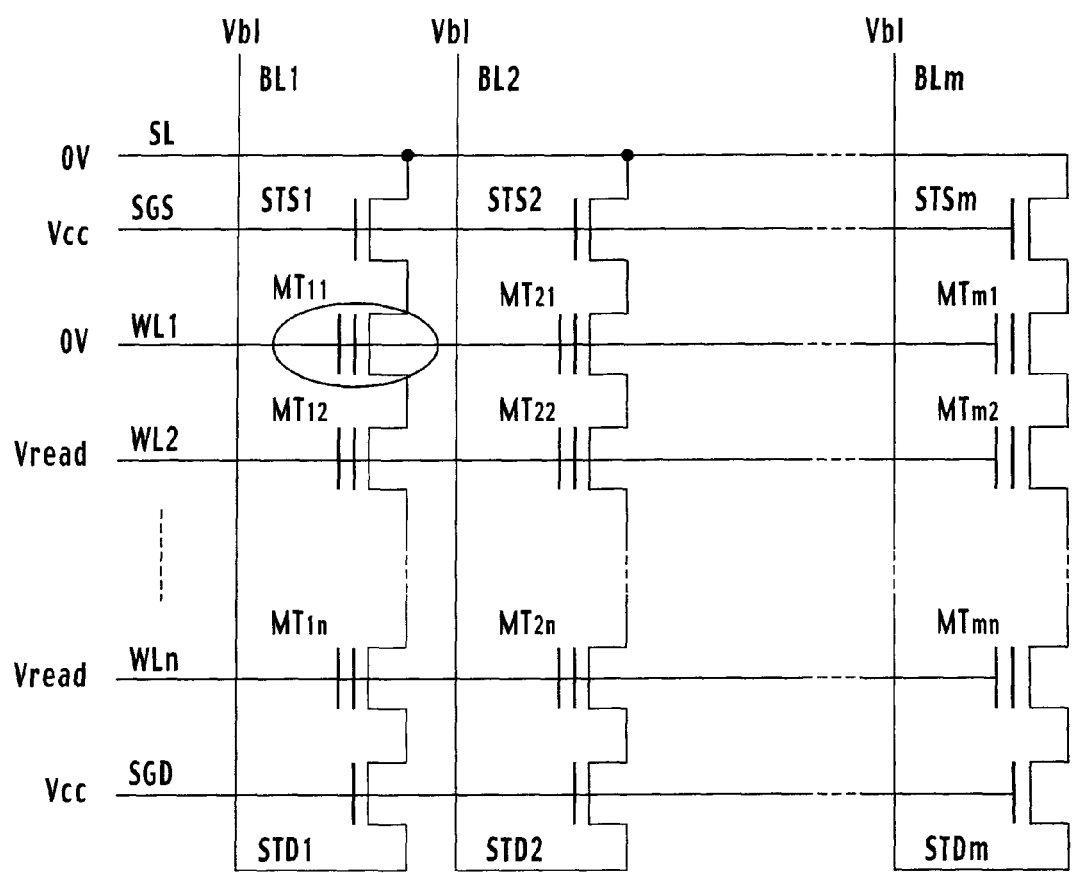
FIG. 9 is an equivalent circuit diagram for explaining reading operation of the non-volatile semiconductor memory according to the embodiment of the present invention.

Next, a description will be provided for an example of a reading operation with reference to FIGS. 6 and 9. A pre-charged voltage $V_{b1}$ (for example, 1 V) is applied to each of the bit lines BL1 to BLm, and 0 V is applied to the source line SL. The power supply voltage Vcc (for example, 3 V) is applied to the select gate line SGS, so that the select gate transistor STS1 is in the "on" state Accordingly, 0 V in the source line SL is transmitted to the memory cell transistors $MT_{11}$, $MT_{21}$, ..., $MT_{m1}$. The power supply voltage Vcc (for example, 3 V) is applied to the select gate line SGD, so that the select gate transistor STD1 is in the "on" state. Accordingly, the pre-charged voltage $V_{b1}$ (for example, 1 V) in the bit lines BL1 to BLm is transmitted to the memory cell transistors $MT_{1n}$, $MT_{2n}$, ..., $MT_{mn}$.

Figure 10:
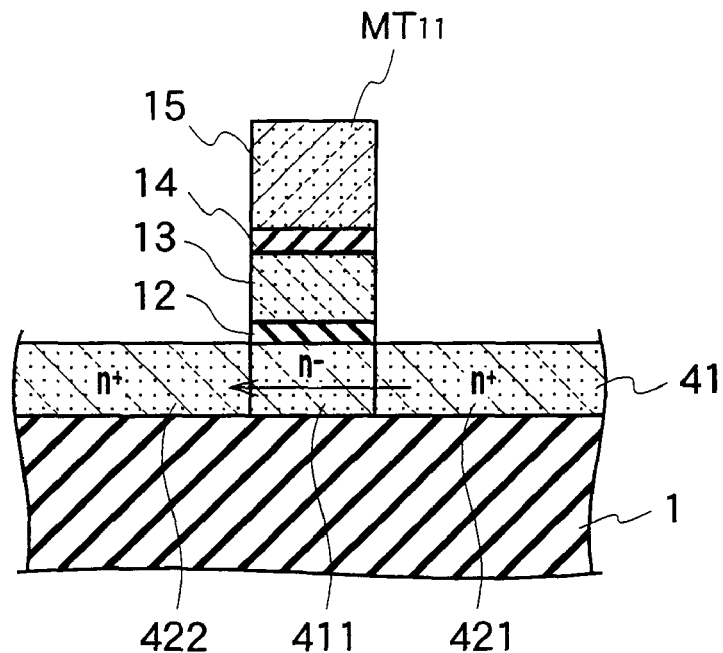
FIG. 10 is a cross-sectional view for explaining a floating gate electrode, which does not store electron of the memory cell transistor of the non-volatile semiconductor memory according to the embodiment of the present invention.
Figure 11:
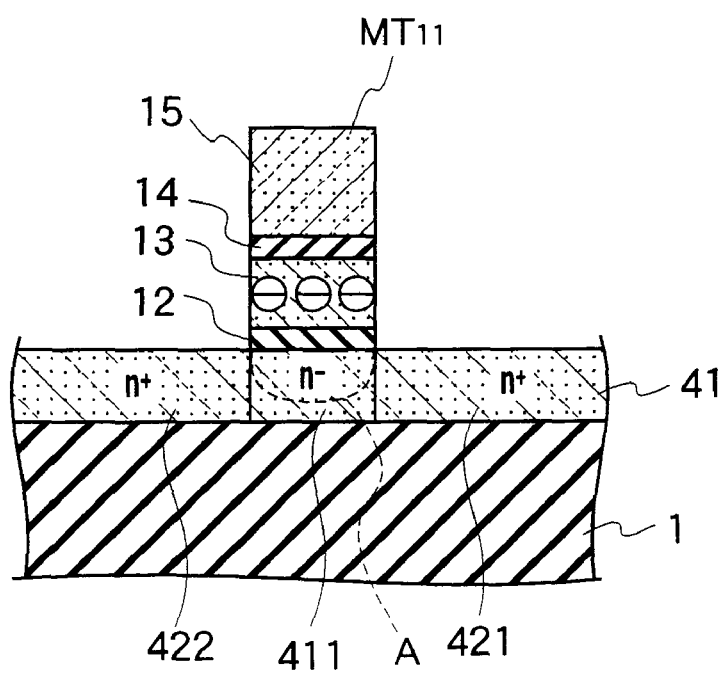
FIG. 11 is a cross-sectional view for explaining the floating gate electrode stores electron of the memory cell transistor of the non-volatile semiconductor memory according to the embodiment of the present invention.

A voltage $V_{read}$ (for example, 4.5 V), which is higher than the power supply voltage Vcc, is applied to the non-selected word lines WL2 to WLm, so that the non-selected memory cell transistors $MT_{12}$ to $MT_{1n}$, $MT_{21}$ to $MT_{2n}$, and $MT_{m1}$ to $MT_{mn}$ are in the "on" state. Accordingly, the non-selected memory cell transistors $MT_{12}$ to $MT_{1n}$, $MT_{21}$ to $MT_{2n}$, and $MT_{11}$ to $MT_{mn}$ serve as transfer transistors. A voltage of 0 V is applied to the selected word line WL1. In the memory cell transistor $MT_{11}$, 0 V is applied to the control gate electrode 15 as shown in FIGS. 10 and 11. In a case where electrons have not been accumulated in the floating gate electrode 13 as shown in FIG. 10, the threshold voltage Ve of the selected memory cell transistor $MT_{11}$ is less than 0 V as shown in FIG. 5. For this reason, even if the voltage applied to the control gate electrode 15 is 0 V, the selected memory cell transistor $MT_{11}$ is in the "on" state, and accordingly channel current flows. On the other hand, when electrons have accumulated in the floating gate electrode 13 as shown in FIG. 11, the threshold voltage Vp of the selected memory cell transistor $MT_{11}$ is higher than 0 V as shown in FIG. 5. A depletion layer A of the channel region 411 underneath the floating gate electrode 13 spreads as shown in FIG. 11. Accordingly, the memory cell transistor $MT_{11}$ is in the "off" state. Thus, the channel current does not flow. If the channel current flows into the selected memory cell transistor $MT_{11}$, it is judged on determined that the selected memory cell transistor $MT_{11}$ is in the "erase" state (data is "1"). If the channel current does not flow into the selected memory cell transistor $MT_{11}$, it is judged on determined that the selected memory cell transistor $MT_{11}$ is in the "write" state (data is "0").

Figure 41:
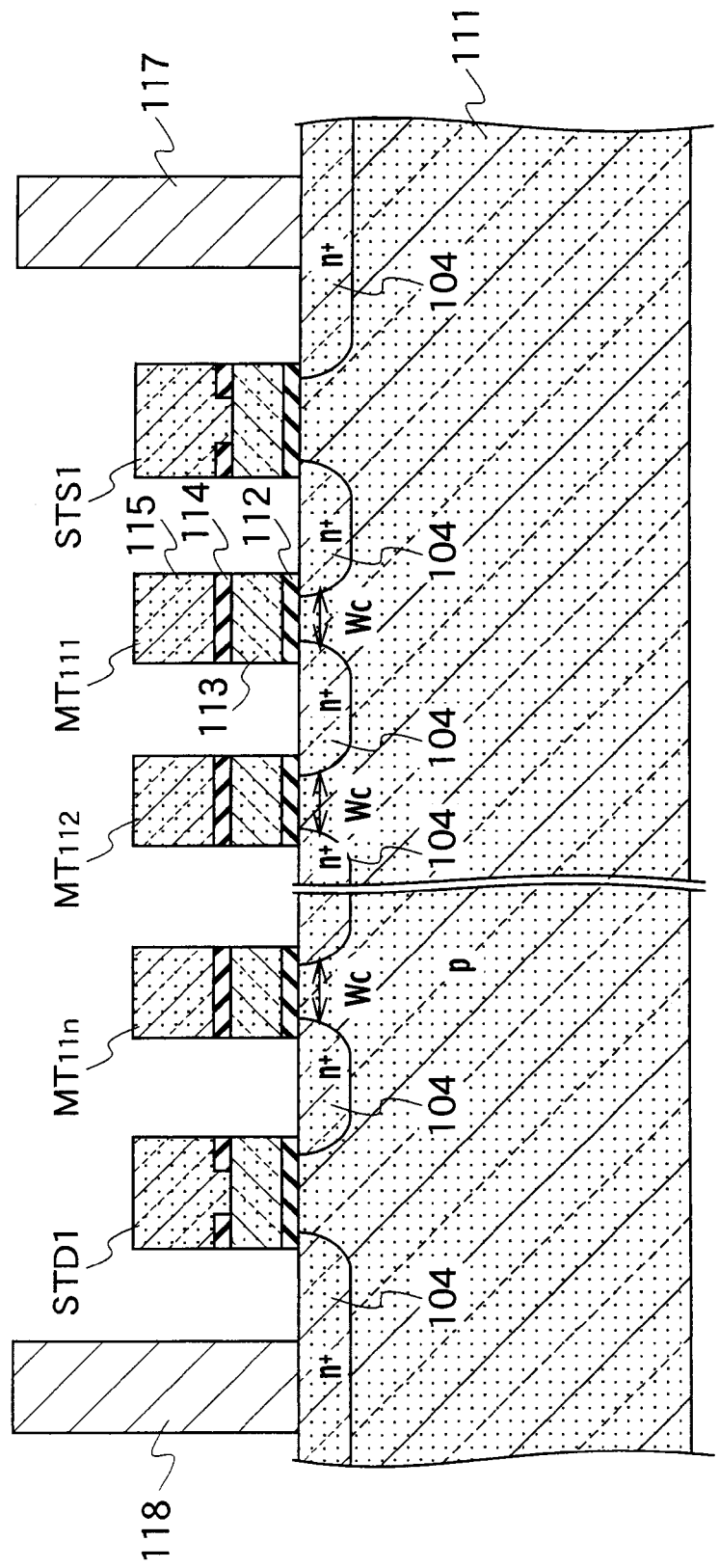
FIG. 41 is a cross-sectional view in the row direction showing a cell array of a non-volatile semiconductor memory according to a comparative example.

FIG. 41 shows a comparative example of enhancement memory cell transistors $MT_{111}$ to $MT_{11n}$. Each of the memory cell transistors $MT_{111}$ to $MT_{11n}$ includes an n+-source and drain region 104 which are provided on a p-semiconductor substrate 111, and a floating gate electrode 113 and a control gate electrode 115 which are provided above a channel region between the source and drain regions 104. As each of the memory cell transistors MT111 to MT11n as the enhancement transistor has been minaturized, the width W of the channel region between the source and drain regions 104 has become so narrow that the influence of the short channel effect has increased. On the contrary, the channel region is depleted in a state where electrons have been accumulated in the floating gate electrode 13, thereby enabling the short channel effect to be reduced. This is because the memory cell transistors $MT_{11}$ to $MT_{1n}$ are depletion mode transistors having the source and drain regions 421 to 42(n+1) and the channel regions 411 to 41n.

In addition, in a case where electrons have accumulated in the floating gate electrode 13 of the selected memory cell transistor $MT_{11}$ as shown in FIG. 11, when 0 V is applied to the control gate electrode 15 during a reading operation, the channel region 411 is depleted, thus enabling the selected memory cell transistor $MT_{11}$ to be fully in the "off" state. The thinner the SOI layer 2 is, the easier for the memory cell transistors MT11 to $MT_{1n}$ to be in the "off" state. For this reason, it is preferable that the SOI layer 2 may have a thickness of approximately 30 nm to 40 nm, and it is more preferable that the SOI layer 2 may have a thickness of approximately 30 nm to 35 nm.

Furthermore, in the NAND flash EEPROM to which the SOI technology is adapted, a voltage of the same polarity is applied during operations of writing, erasing and reading as shown in FIG. 6, thereby the operations can be performed in common with the NAND flash EEPROM to which the SOI technology is not adapted. Consequently, the timing adjustment is easier, and the area of the peripheral circuit portion can be reduced, in comparison with a case where operation voltages of the two polarities, positive and negative, are applied.

Moreover, it is easier to cut off the source line SL and the bit line BL1, since the select gate transistors STS1 and STD1, shown in FIG. 1, connected in series in the column direction with the memory cell transistors $MT_{11}$ to $MT_{1n}$ are enhancement transistors.

Figure 42:
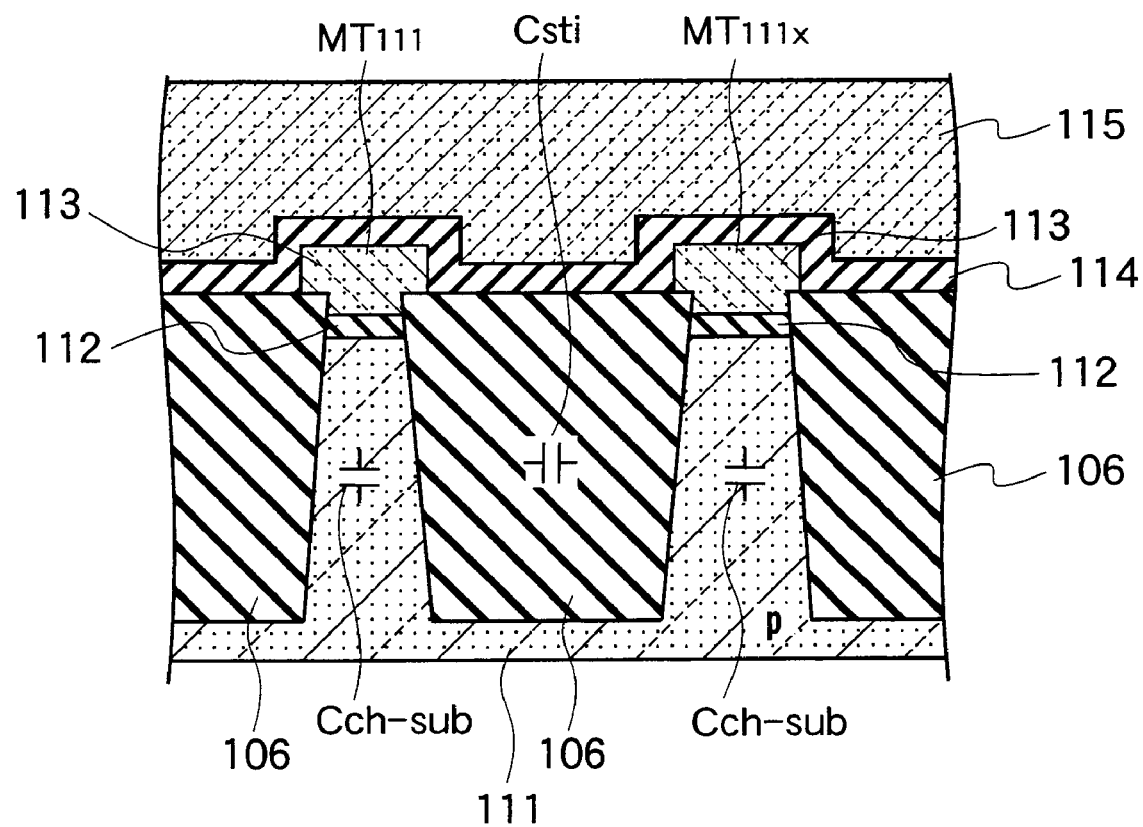
FIG. 42 is a cross-sectional view in the row direction showing the call array of a non-volatile semiconductor memory according to the comparative example.

Additionally, in the comparative example, influence of a capacitance $C_{ch-sub}$ between the channel region 104 and the semiconductor substrate 111 is large as shown in FIG. 42. On the other hand, the capacitance of the SOI layer 2 can be reduced because of the SOI structure in which the SOI layer 2 is formed on the SOI insulator 1 as shown in FIG. 1. In addition, the memory cell transistors MT111 and MT121 of the comparative case are isolated from one another in the row direction by element isolation regions (STI) 106, respectively, as shown in FIG. 42, and a parasitic capacitance $C_{sti}$ is generated between the element isolation regions (STI) 106. On the other hand, the memory cell transistors $MT_{11}$ and $MT_{21}$ in the row direction are completely isolated from each other by the element isolation insulating film 6 as shown in FIG. 3. Consequently, parasitic capacitance $C_{sti}$ influence between the element isolation regions (STI) 106 shown in FIG. 42 can be reduced. Accordingly, punch-through immunity, field inversion breakdown voltage and the like do not have to be considered. For this reason, the widths Ws of the respective element isolation insulating films 6 in the row direction shown in FIG. 3 can be set at a minimum width for allowing lithographic and etching techniques.

The peripheral circuit (MOS transistor), which is not illustrated, for driving the memory cell transistors $MT_{11}$ to $MT_{1n}$, $MT_{21}$ to $MT_{2n}$, ..., MTm1 to MTmn can also be formed on the SOI layer 2 provided in the SOI insulator 1. With regard to an n-channel MOS transistor used for a CMOS circuit, a p-type impurity diffusion layer and an n-type impurity diffusion layer may be used, in common with the select gate transistor. With regard to a p-channel MOS transistor used for the CMOS circuit, an n-type impurity diffusion layer and a p-type impurity diffusion layer may be used.

Next, a description will be provided for an example of a method for fabricating the non-volatile semiconductor memory according to the present embodiment. Here, FIGS. 12A, 13A, ..., and 23A show a fabrication cross-sectional process flow of the cell array 100 shown in FIG. 2 in the column direction taken along the III-III line. In addition, FIGS. 12B, 13B, ..., and 23B show a fabrication cross-sectional process flow of the cell array 100 in the row direction taken along the II-II line.

Figure 12A:
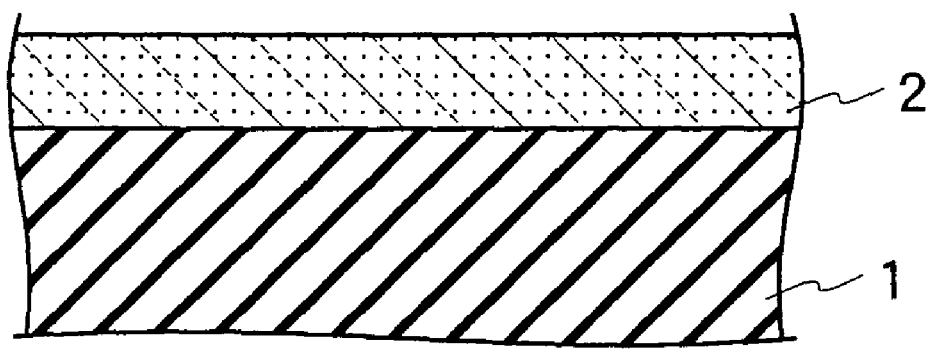
FIG. 12A is a cross-sectional view in the column direction (III-III direction of FIG. 2) showing an example of a method for fabricating the non-volatile semiconductor memory according to the embodiment of the present invention.
Figure 12B:
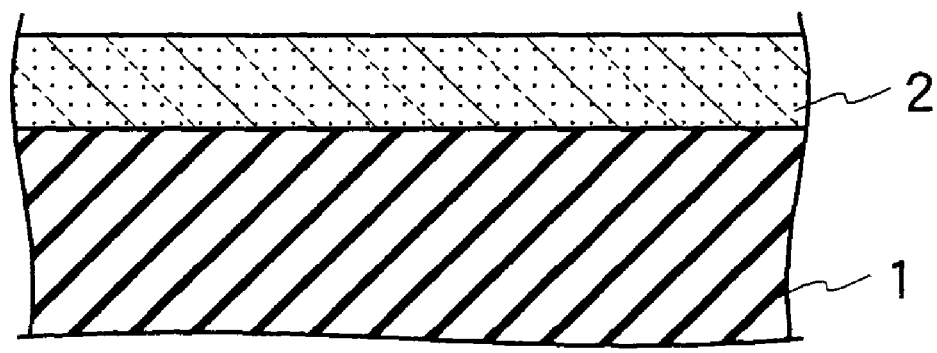
FIG. 12B is a cross-sectional view in the column direction (II-II direction of FIG. 2) showing an example of the method for fabricating the non-volatile semiconductor memory according to the embodiment of the present invention.

As shown in FIGS. 12A and 12B, the SOI layer 2 having a first conductivity type provided on the SOI insulator 1 is prepared. As a technique for providing the SOI layer 2 on the SOI insulator 1, the SIMOX technique, the wafer bonding technique and the like can be used. According to the SIMOX technique, oxygen ions ($O^+$) are implanted into a silicon (Si) substrate, which is not illustrated, and then the silicon substrate is thermally treated. Thereby, the SOI insulator 1 is formed in the Si substrate, and the SOI layer 2 is formed on the SOI insulator 1. According to the wafer bonding technique, the SOI insulator 1 is formed on one of the two wafers. Then, the two wafers are bonded, and are thermally treated. Subsequently, one of the two wafers is made into a thin film through planarization, thereby forming the SOI layer 2.

Figure 13A:
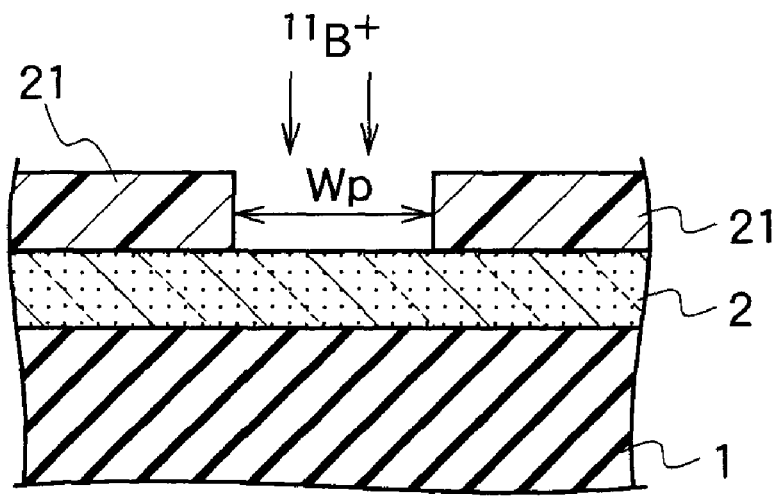
FIG. 13A is a cross-sectional view in the column direction after the process of FIG. 12A showing the method for fabricating the non-volatile semiconductor memory according to the embodiment of the present invention.
Figure 13B:
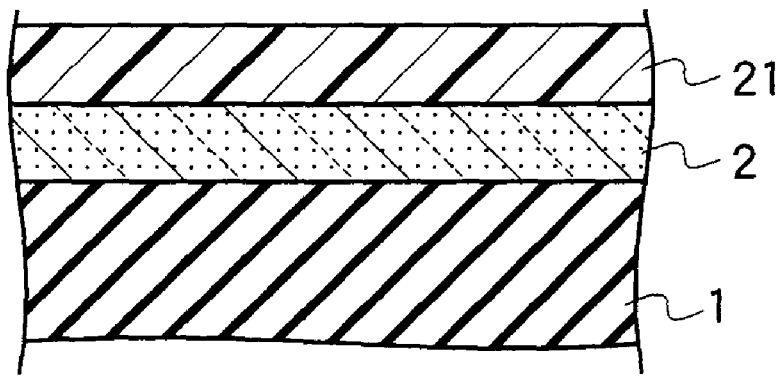
FIG. 13B is a cross-sectional view in the row direction after the process of FIG. 12B showing the method for fabricating the non-volatile semiconductor memory according to the embodiment of the present invention.
Figure 14A:
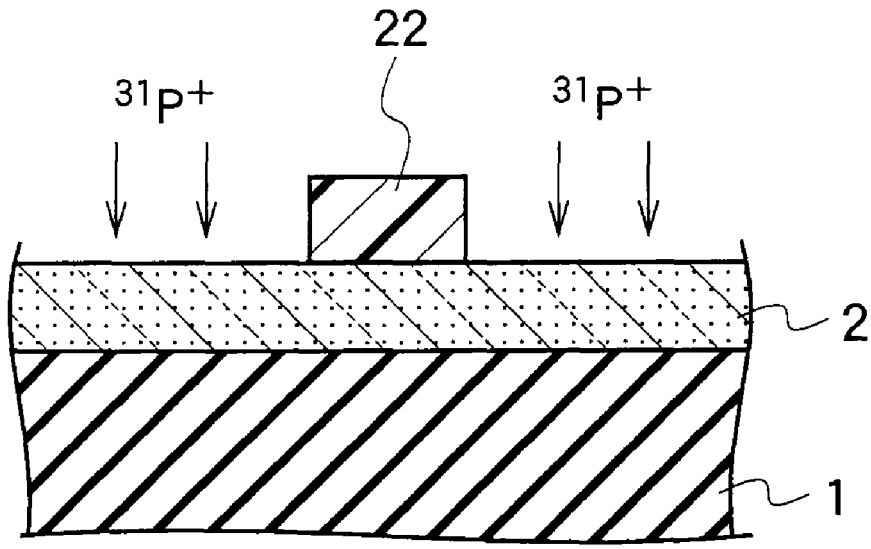
FIG. 14A is a cross-sectional view in the column direction after the process of FIG. 13A showing the method for fabricating the non-volatile semiconductor memory according to the embodiment of the present invention.
Figure 14B:
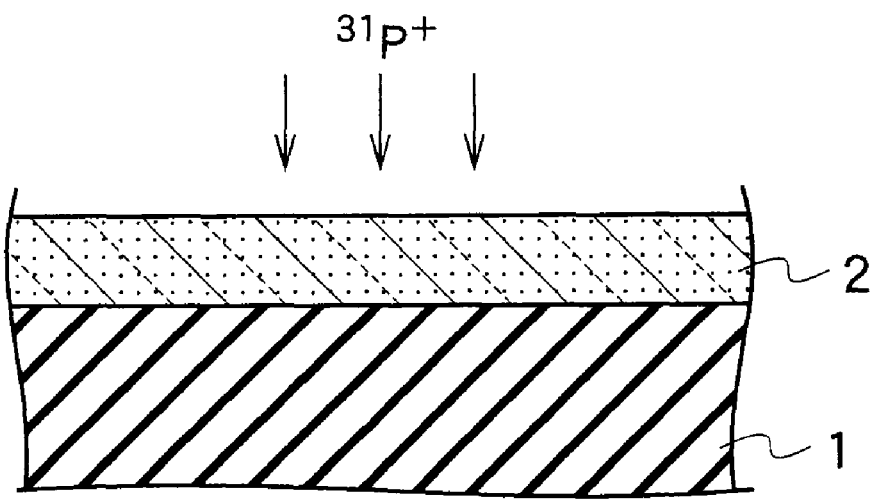
FIG. 14B is a cross-sectional view in the row direction after the process of FIG. 13B showing the method for fabricating the non-volatile semiconductor memory according to the embodiment of the present invention.

A resist film is coated on the SOI layer 2, and the resist film is patterned by the lithographic technique. As shown in FIGS. 13A and 13B, ions having p-type impurity such as boron ($^{11}B^+$) are implanted with the patterned resist film 21 used as a mask. Residual resist film 21 is removed by use of resist remover or the like. A resist film is coated on the SOI layer 2, and then the resist film is patterned with the lithographic technique. Subsequently, as shown in FIGS. 14A and 14B, ions having n-type impurity, such as phosphorus ($^{31}P^+$) and arsenic ($^{75}As^+$), are implanted with the patterned resist film 22 used as a mask. When deemed necessary, a resist film is also coated on the region surrounding the cell array 100, where the peripheral circuit is to be formed, and the coated resist film is patterned. Then, if necessary, ions are implanted.

Figure 15A:
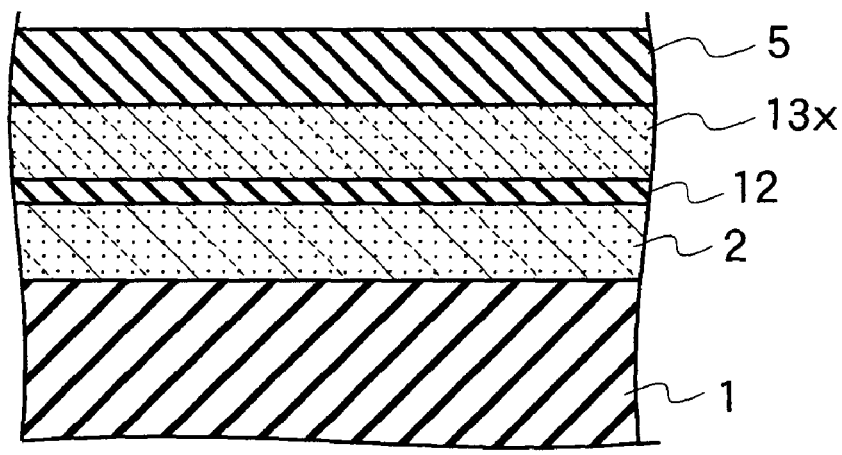
FIG. 15A is a cross-sectional view in the column direction after the process of FIG. 14A showing the method for fabricating the non-volatile semiconductor memory according to the embodiment of the present invention.
Figure 15B:
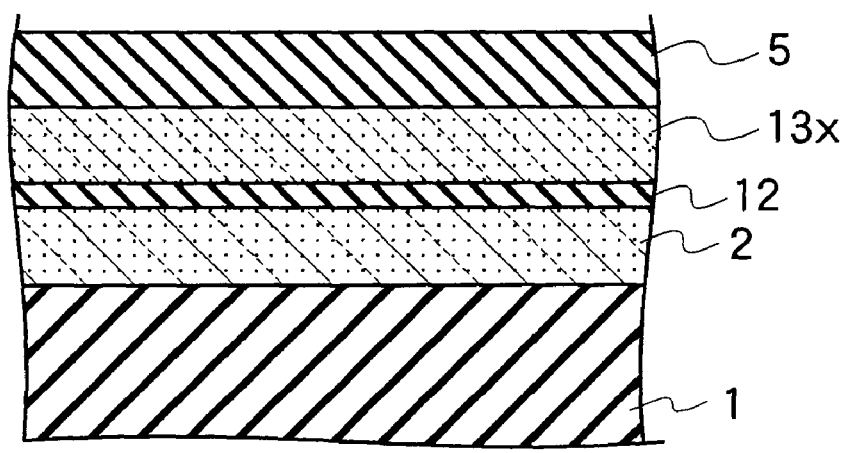
FIG. 15B is a cross-sectional view in the row direction after the process of FIG. 14B showing the method for fabricating the non-volatile semiconductor memory according to the embodiment of the present invention.

As shown in FIGS. 15A and 15B, a gate insulating film (tunnel oxidation film) 12 such as a $SiO_2$ film is formed by use of the thermal oxidation method so that the thickness of the gate insulating film is approximately 1 nm to 15 nm. A p-doped first polysilicon layer (floating gate electrode) 13x, which is going to be a floating gate electrode, is deposited on the gate insulating film 12 by reduced pressurized CVD so that the thickness of the first polysilicon layer may be 10 nm to 200 nm. Subsequently, a mask material 5 such as a $Si_3N_4$ film is deposited on the first polysilicon layer 13x by CVD so that the thickness of the mask material may be approximately 50 nm to 200 nm.

A resist film is spin-coated on the mask material 5, and an etching mask of the resist film is formed by the lithographic technique. Parts of the mask material 5 are removed in a selective manner by the reactive ion etching (RIE) in which an etching mask is used. After etching, the resist film is removed.

Figure 16A:
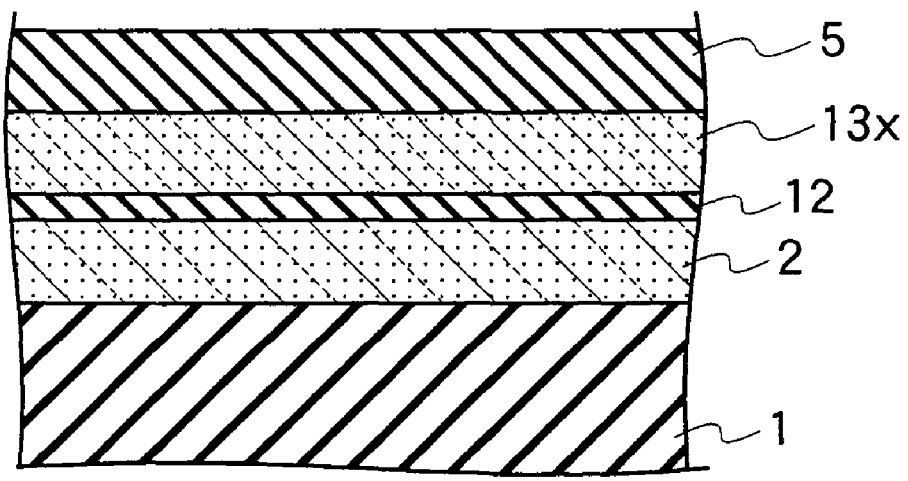
FIG. 16A is a cross-sectional view in the column direction after the process of FIG. 15A showing the method for fabricating the non-volatile semiconductor memory according to the embodiment of the present invention.
Figure 16B:
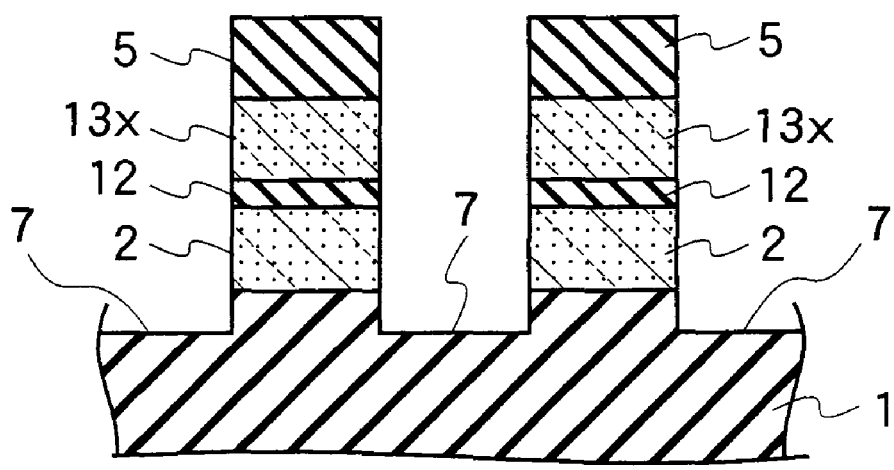
FIG. 16B is a cross-sectional view in the row direction after the process of FIG. 15B showing the method for fabricating the non-volatile semiconductor memory according to the embodiment of the present invention.

With the mask material 5 used as a mask, parts of the first polysilicon layer 13x, the gate insulating film 12 and the SOI layer 2 are removed in the column direction in a selective manner until the SOI insulating layer 1 underneath the parts is exposed. As a result, groove portions 7 are formed which penetrate through the first polysilicon layer 13x, the gate insulating film 12 and the SOI layer 2, as shown in FIGS. 16A and 16B. Although FIG. 16B shows that parts of the SOI insulating layer 1 are removed, the SOI insulating layer 1 may remain planar.

Figure 17A:
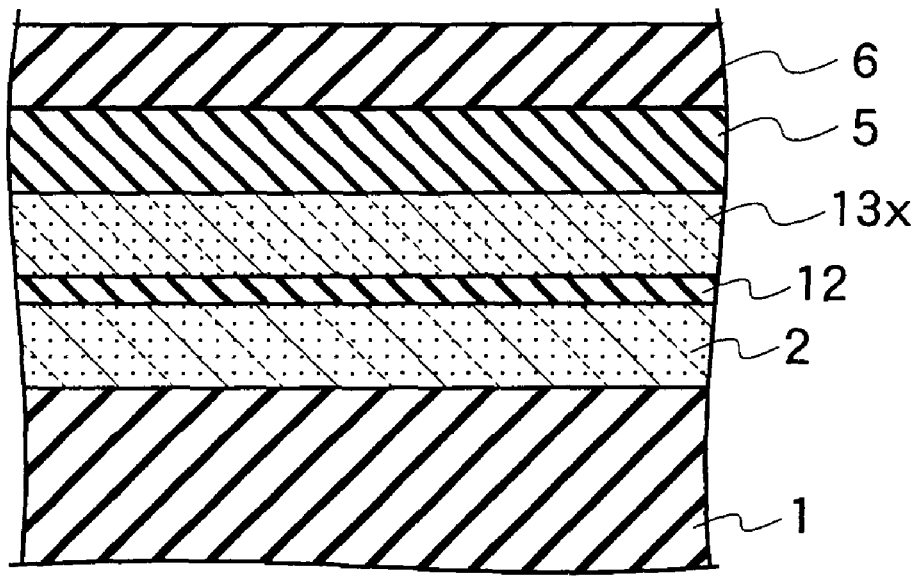
FIG. 17A is a cross-sectional view in the column direction after the process of FIG. 16A showing the method for fabricating the non-volatile semiconductor memory according to the embodiment of the present invention.
Figure 17B:
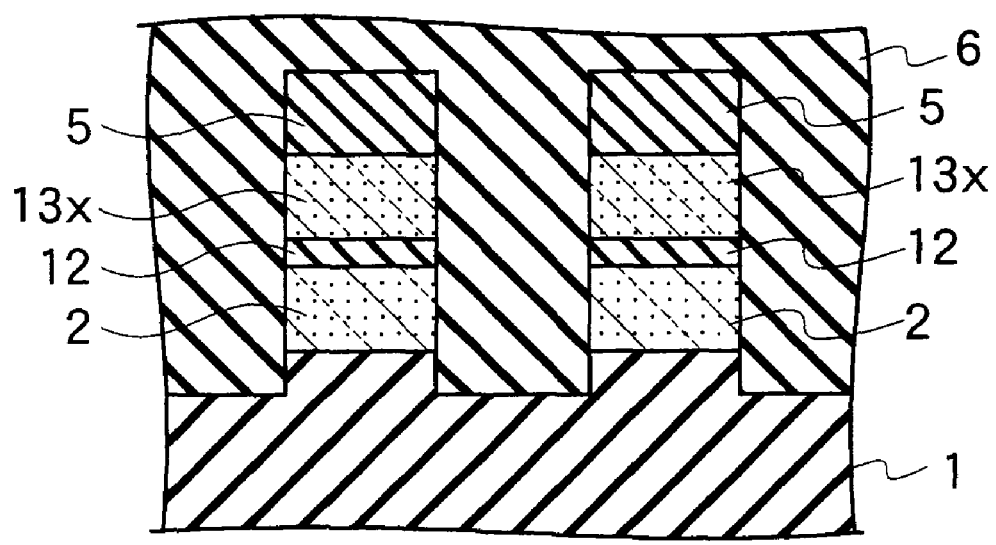
FIG. 17B is a cross-sectional view in the row direction after the process of FIG. 16B showing the method for fabricating the non-volatile semiconductor memory according to the embodiment of the present invention.
Figure 18A:
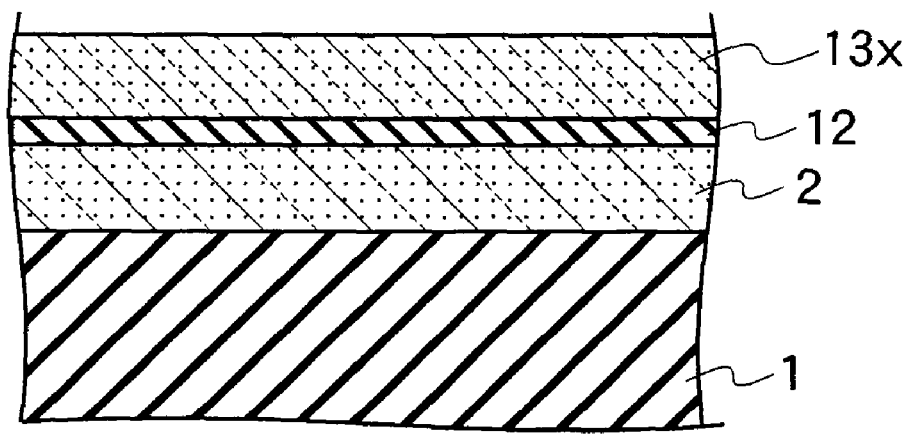
FIG. 18A is a cross-sectional view in the column direction after the process of FIG. 17A showing the method for fabricating the non-volatile semiconductor memory according to the embodiment of the present invention.
Figure 18B:
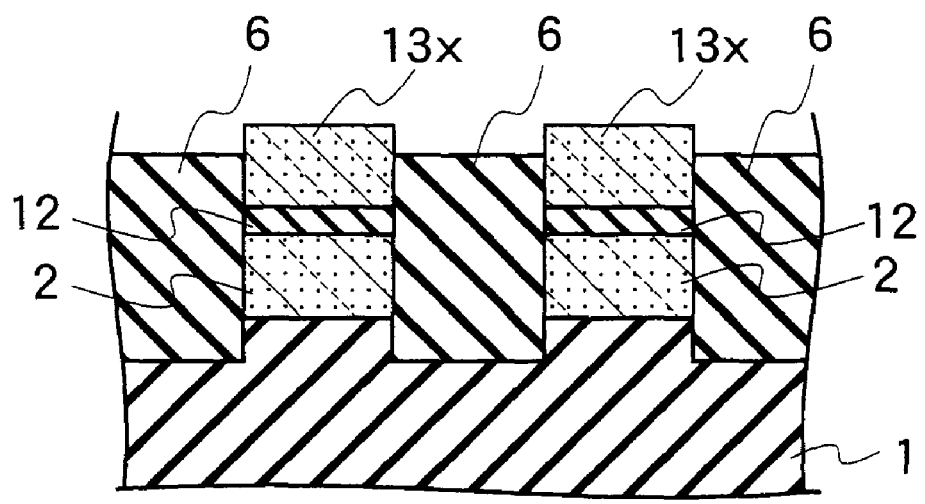
FIG. 18B is a cross-sectional view in the row direction after the process of FIG. 17B showing the method for fabricating the non-volatile semiconductor memory according to the embodiment of the present invention.

As shown in FIGS. 17A and 17B, an element isolation insulating film 6 is embedded in the groove portions 7 shown in FIG. 16B by CVD or the like so that the thickness of the element isolation insulating film 6 is approximately 200 nm to 1,500 nm. As shown in FIGS. 18A and 18B, the element isolation insulating film 6 is etched back by use of chemical-mechanical polishing (CMP) so that the element isolation insulating film 6 may be planarized. The upper surfaces of the element isolation insulating films 6 are situated in positions higher than the upper surfaces of the gate insulating films 12. As a result, the elements of the memory cell transistors $MT_{11}$ to $MT_{21}$ in the row direction are completely isolated from one another.

Figure 19A:
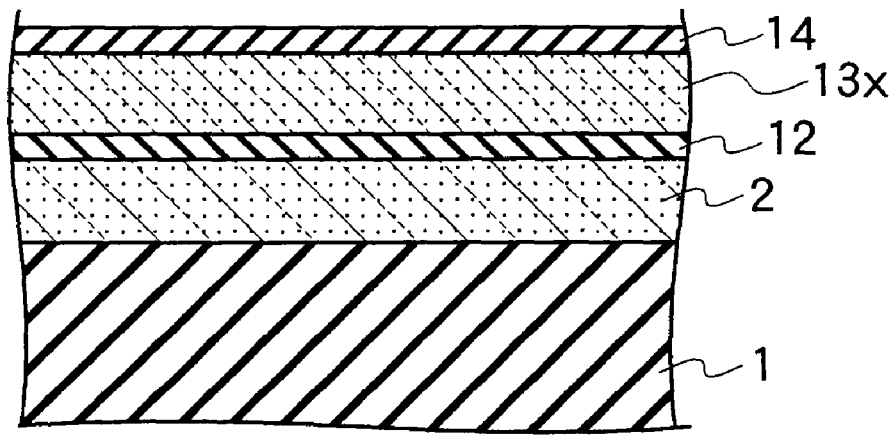
FIG. 19A is a cross-sectional view in the column direction after the process of FIG. 18A showing the method for fabricating the non-volatile semiconductor memory according to the embodiment of the present invention.
Figure 19B:
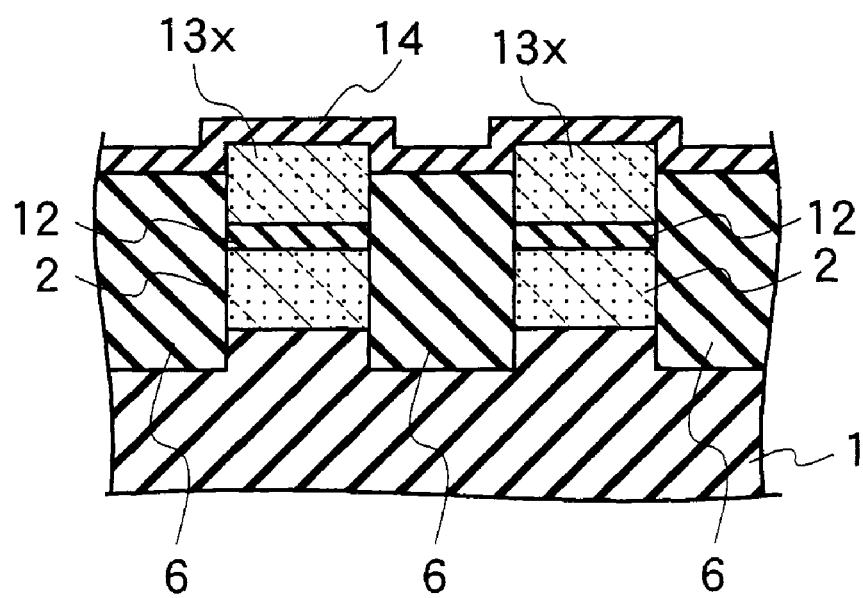
FIG. 19B is a cross-sectional view in the row direction after the process of FIG. 18B showing the method for fabricating the non-volatile semiconductor memory according to the embodiment of the present invention.
Figure 20A:
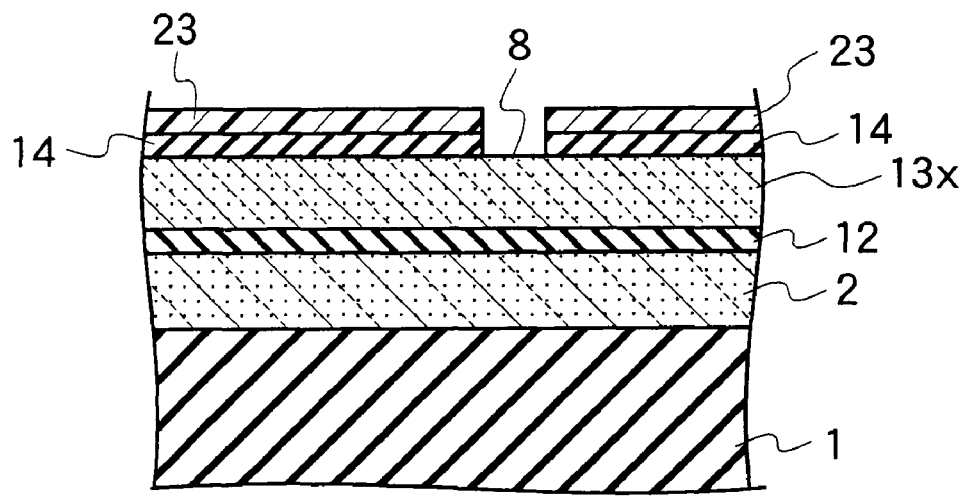
FIG. 20A is a cross-sectional view in the column direction after the process of FIG. 19A showing the method for fabricating the non-volatile semiconductor memory according to the embodiment of the present invention.
Figure 20B:
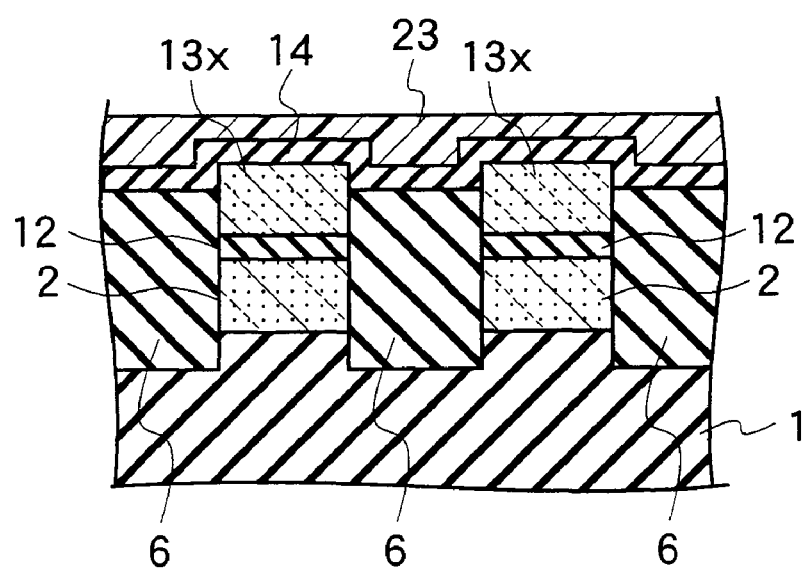
FIG. 20B is a cross-sectional view in the row direction after the process of FIG. 19B showing the method for fabricating the non-volatile semiconductor memory according to the embodiment of the present invention.
Figure 21A:
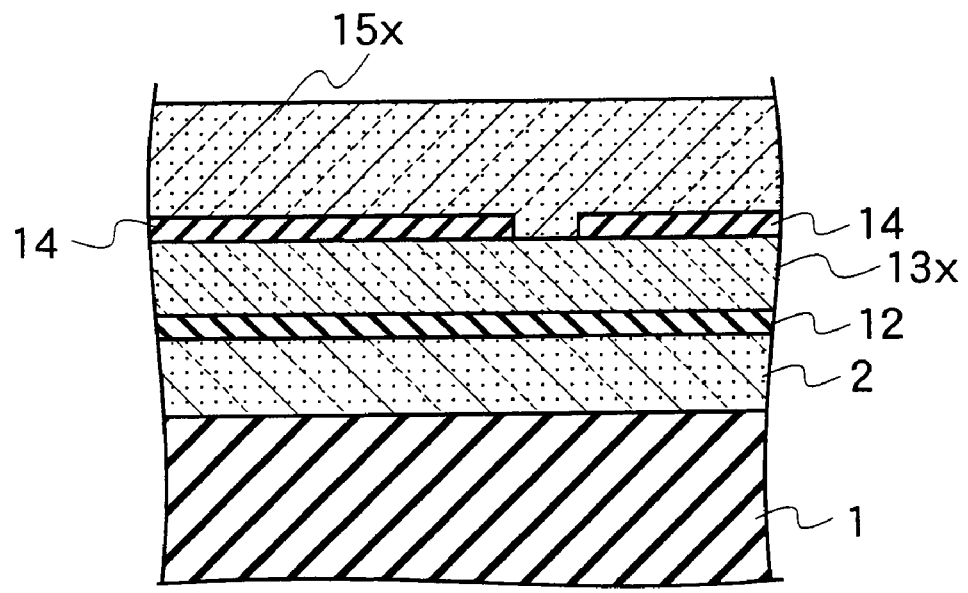
FIG. 21A is a cross-sectional view in the column direction after the process of FIG. 20A showing the method for fabricating the non-volatile semiconductor memory according to the embodiment of the present invention.
Figure 21B:
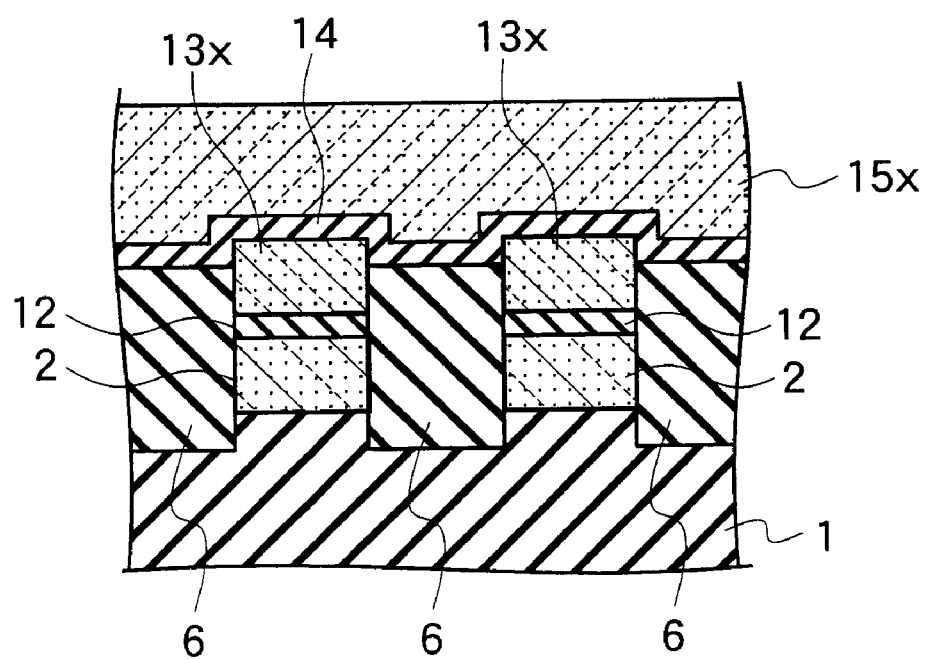
FIG. 21B is a cross-sectional view in the row direction after the process of FIG. 20B showing the method for fabricating the non-volatile semiconductor memory according to the embodiment of the present invention.

As shown in FIGS. 19A and 19B, an inter-electrode insulating film 14 is deposited on the tops of the first polysilicon layers 13x and the tops of the element isolation insulating films 6 by CVD or the like. A resist film 23 is coated on the inter-electrode insulating film 14, and the resist film 23 is patterned by the lithographic technique. As shown in FIGS. 20A and 20B, opening portions 8 are formed in a part of the inter-electrode insulating film 14 with the patterned resist film 23 used as a mask by RIE or the like. As shown in FIGS. 21A and 21B, a p-doped second polysilicon layer (control gate electrode) 15x, which will be a control gate electrode, is deposited on the inter-electrode insulating film 14 by CVD so that the thickness of the second polysilicon layer 15x is approximately 10 nm to 200 nm.

Figure 22A:
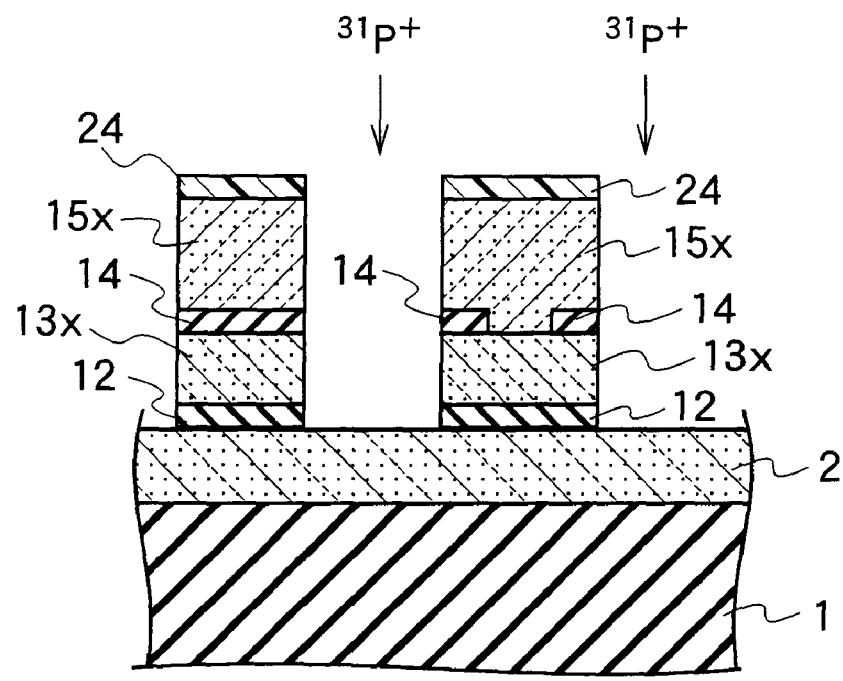
FIG. 22A is a cross-sectional view in the column direction after the process of FIG. 21A showing the method for fabricating the non-volatile semiconductor memory according to the embodiment of the present invention.
Figure 22B:
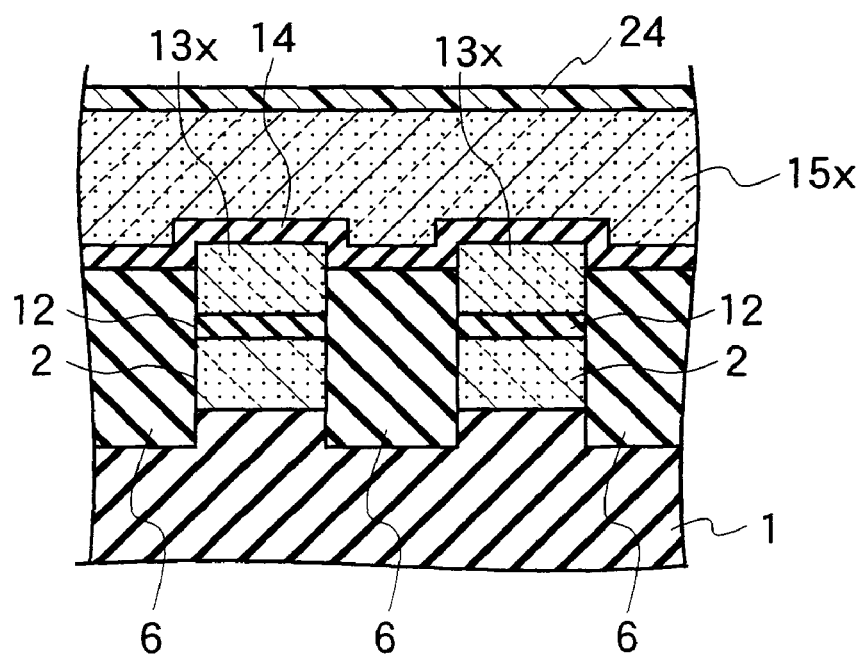
FIG. 22B is a cross-sectional view in the row direction after the process of FIG. 21B showing the method for fabricating the non-volatile semiconductor memory according to the embodiment of the present invention.

A resist film 24 is coated on the second polysilicon layer 15x, and the resist film 24 is patterned by the lithographic technique. As shown in FIGS. 22A and 22B, parts of the second polysilicon layer 15x, the inter-electrode insulating layer 14, and the first polysilicon layer 13x are removed in the row direction with the patterned resist film 24 used as a mask by RIE in a selective manner until the gate insulating film 12 underneath the parts is exposed. As a result, grooves are formed which penetrate through the second polysilicon layer 15x, the inter-electrode insulating film 14 and the first polysilicon layer 13x. The resist film 24 is removed by a resist remover and the like.

Figure 23A:
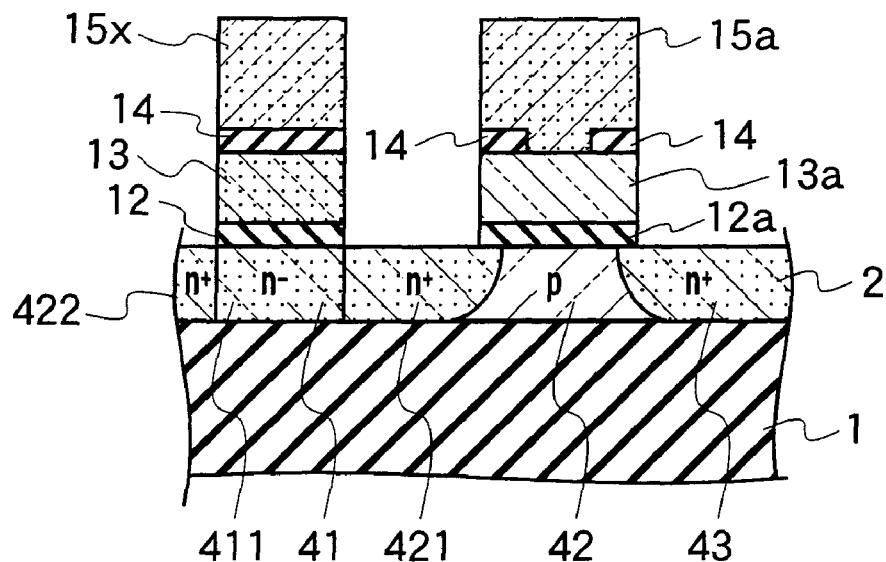
FIG. 23A is a cross-sectional view in the column direction after the process of FIG. 22A showing the method for fabricating the non-volatile semiconductor memory according to the embodiment of the present invention.
Figure 23B:
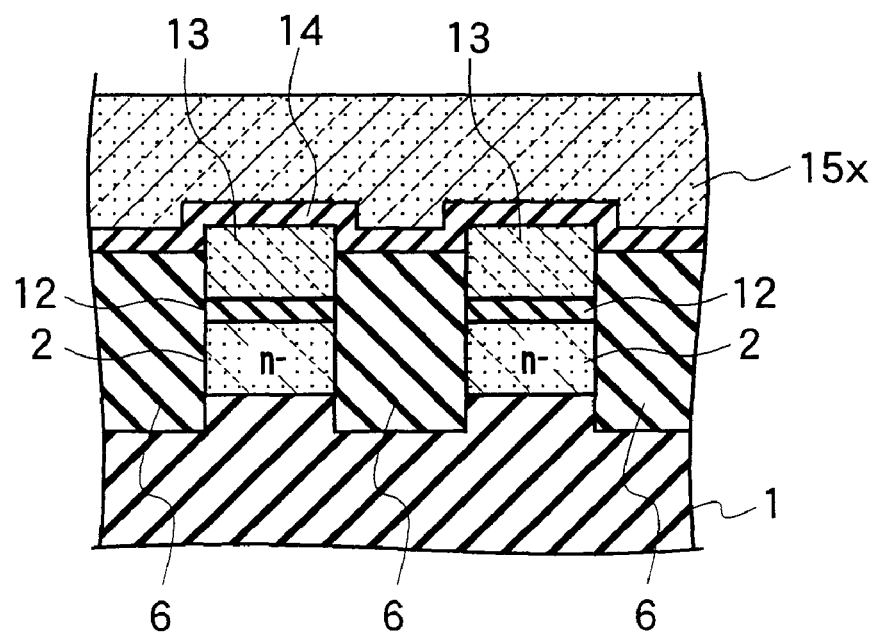
FIG. 23B is a cross-sectional view in the row direction after the process of FIG. 22B showing the method for fabricating the non-volatile semiconductor memory according to the embodiment of the present invention.

Ions of $^{31}P^+$ or $^{75}As^+$ are implanted through the gate insulating films 12 in a self-aligned manner with the second polysilicon layer 15x used as a mask. Subsequently, n-type impurity ions of the first polysilicon layers 13x and the second polysilicon layers 15x are activated by thermal treatment. Thereby, the floating gate electrodes 13 and the control gate electrodes 15 are formed. As shown in FIGS. 23A and 23B, p-type impurity ions and n-type impurity ions in the SOI layer 2 are activated. Accordingly, $n^+$-type impurity diffusion layers (source and drain regions) 421 and 422 are formed in the SOI layer 2 positioned at the bottom of grooves as shown in FIG. 1, and an $n^-$-type impurity diffusion layer (channel region) 411 is formed in the SOI layer 2 underneath the first polysilicon layer 13x. Consequently, the depletion mode memory cell transistor $MT_{11}$ is formed. Similarly, $n^+$-type impurity diffusion layers (source and drain regions) 423 to 42(n+1) are formed in the SOI layer 2 positioned at the bottom of the grooves as shown in FIG. 1, and $n^-$-type impurity diffusion layers (channel regions) 412 to 41n are formed in the SOI layer 2 underneath the first polysilicon layer 13x. Consequently, the memory cell transistors, illustration omitted, are crossed in the column direction and in the row direction and the memory cell transistors are formed in a matrix.

Simultaneously, the select gate electrodes 13a and 15a are formed as shown in FIGS. 23A and 23B. A p-type impurity diffusion layer (channel region) 42 is formed in the SOI layer 2, and an n+-type impurity diffusion layer (source region) 43 is formed. Thereby, an enhancement mode select gate transistor STS1 is formed. The select gate electrodes 13b and 15b shown in FIG. 1 are formed, and the p– impurity diffusion layer (channel region) 44 and the n+-type impurity diffusion layer (drain region) 45 are formed. Thereby, the enhancement mode select gate transistor STD1 is also formed. Subsequently, predetermined interconnects and insulating films are formed or deposited, thereby completing the non-volatile semiconductor memory shown in FIG. 1.

In accordance with the method for fabricating the semiconductor storage device according to the embodiment shown in FIGS. 12A to 23B, the non-volatile semiconductor memory shown in FIG. 1 can be provided. Since the element isolation region (STI) 6 as shown in FIG. 1 does not have to be embedded, a miniaturized process can be performed with ease. Note that the method for fabricating the non-volatile semiconductor memory shown in FIG. 12A to FIG. 23B is an example. It is possible to provide the non-volatile semiconductor memory by other various methods.

(First Modification)

Figure 24:
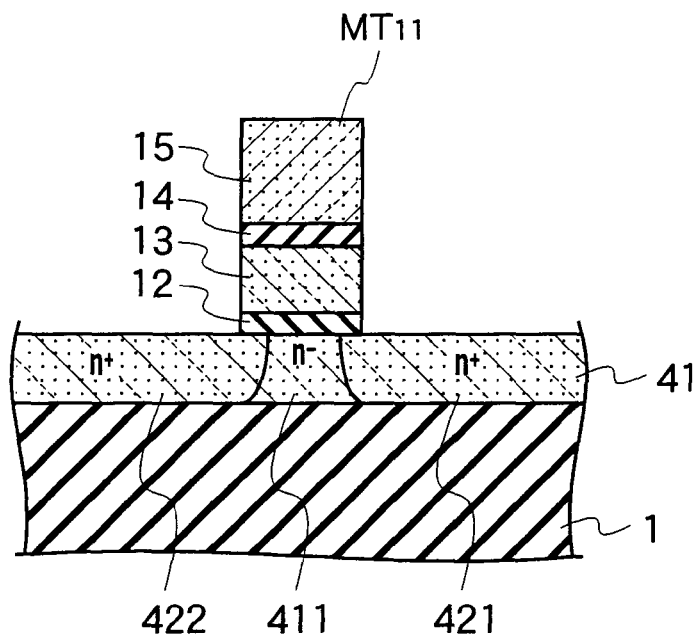
FIG. 24 is a cross-sectional view showing an example of a memory cell transistor of a non-volatile semiconductor memory according to a first modification of the present invention.

In a first modification of the present invention, with regard to the memory cell transistor $MT_{11}$ shown in FIG. 1, n+-source and drain regions 421 and 422 may be extended to parts of an SOI layer 2 underneath a floating gate electrode 13 as shown in FIG. 24.

In a case where the SOI layer 2 underneath the floating gate electrode 13 is comprised of only an n− channel region 411 as shown in FIG. 1, if the voltage in a control gate electrode 15 is 0 V for an erasing operation in a state where electrons have accumulated in the floating gate electrode 13, the erasing operation is retarded due to formation of a depletion layer in the n− channel region 411.

Figure 25:
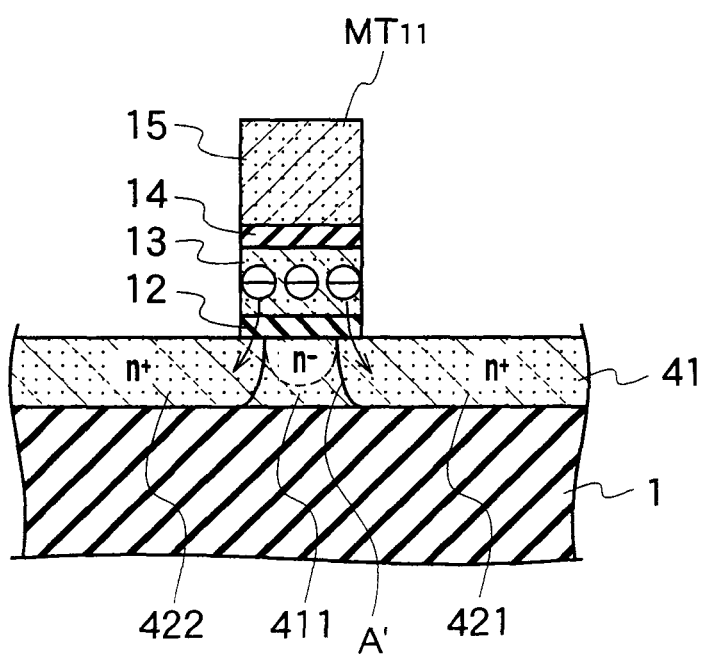
FIG. 25 is a cross-sectional view for explaining operation of the memory cell transistor of the non-volatile semiconductor memory according to the first modification of the present invention.

By contrast, according to the first modification, the n+-source and drain regions 421 and 422 are provided in the SOI layer 2 underneath the floating gate electrode 13 as shown in FIG. 24, thereby the n+-source and drain regions 421 and 422 are not easily depleted. Accordingly, electrons are easily extracted between the floating gate electrode 13 and each of the n+-source and drain regions 421 and 422. For this reason, it is possible to speed up the erasing operation. An n− channel region 411 is provided in the middle of the SOI layer 2 underneath the floating gate electrode 13. Because of this, during the reading operation, the n− channel region 411 underneath the floating gate electrode 13 is depleted as shown in FIG. 25, accordingly forming a depletion layer A'. Thus, channel current can be fully off.

In according with the method for fabricating the non-volatile semiconductor memory according to the first modification, during the source and drain diffusion, the source and drain regions 421 and 422 may be formed by forming the n− channel region 411 in the middle of the SOI layer 2 underneath the floating gate electrode 13 and by diffusing an n-type impurity as far as parts of the SOI layer 2 underneath the floating gate electrode 13.

(Second Modification)

In a method for fabricating a non-volatile semiconductor memory according to a second modification, only p-type impurity ions are implanted in the entire surface of an SOI layer 2, instead of implanting p-type impurity ions and n-type impurity ions into the SOI layer 2 in a selective manner as shown in FIGS. 13A to 14B. Subsequently, a series of steps shown in FIGS. 15A to 22B are performed in substantially the same manner.

Figure 26:
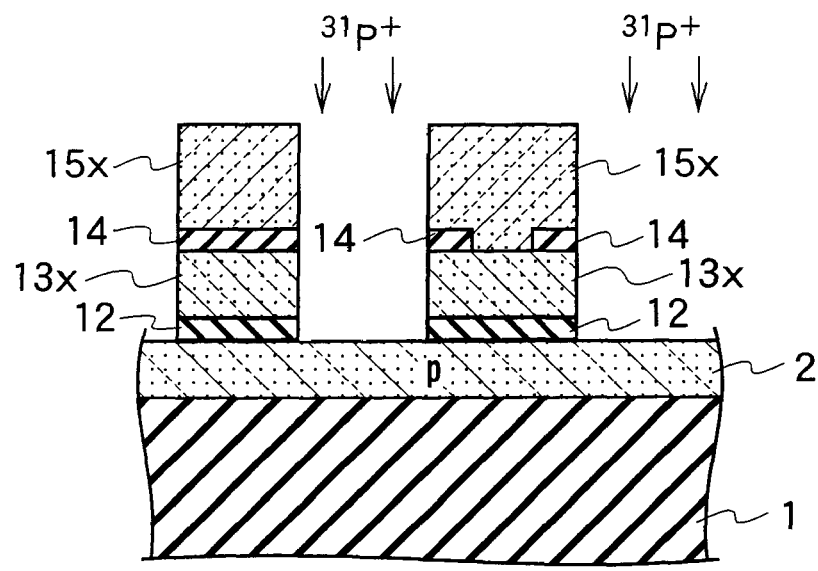
FIG. 26 is a cross-sectional view in the column direction (III-III direction of FIG. 2) showing an example of a method for fabricating the non-volatile semiconductor memory according to a second modification of the present invention.
Figure 27:
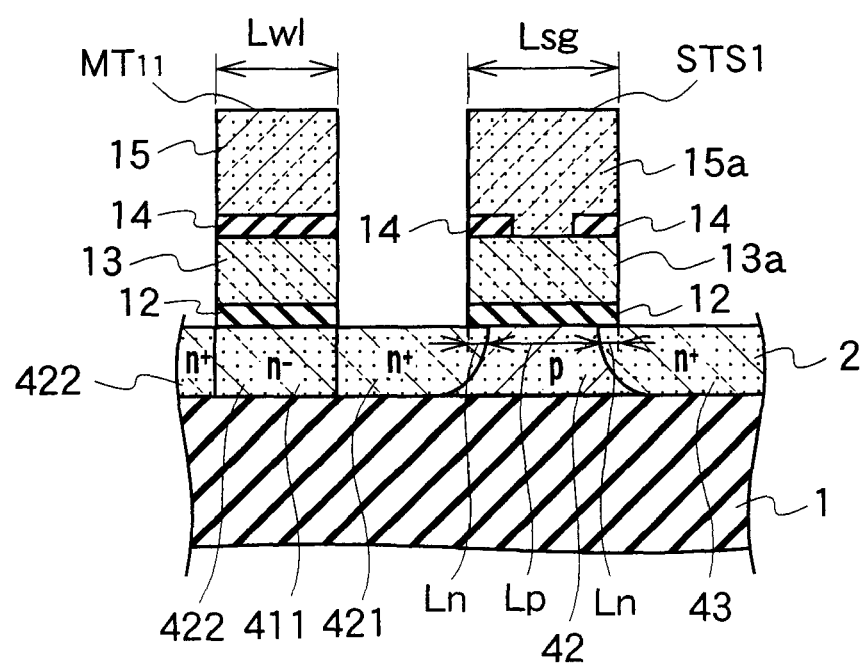
FIG. 27 is a cross-sectional view in the column direction after the process of FIG. 26 showing the method for fabricating the non-volatile semiconductor memory according to the second modification of the present invention.

Then, as shown in FIG. 26, n-type impurity ions are implanted in a self-aligned manner with a second polysilicon layer 15x used as a mask, and a thermal treatment is performed. As a result, n-type impurity ions in the SOI layer 2 are activated, and hence n+-source and drain regions 421 and 422 as well as a source region 43 are formed as shown in FIG. 27. In addition, the n-type impurity ions diffuse, and an n− channel region 411 is formed in the SOI layer 2 underneath a floating gate electrode 13. In the same way, n+-source and drain regions 423 to 42(n+1) as well as n− channel regions 412 to 41n shown in FIG. 1 are formed. The n-type impurity ions diffuse, and hence each of the source and drain region 421 and the source region 43 is expanded by a length Ln into the SOI layer 2 underneath select gate electrodes 13a and 15a. On this point, a length Lw1 of a control gate electrode 15 in a memory cell transistor $MT_{11}$ may be shorter than a length 2Ln aggregating the length Ln of the expansion of the source and drain region 421 and the length Ln of the expanded the source region 43. A length Lsg of each of the select gate electrodes 13a and 15a may be set longer than the length 2Ln aggregating the length Ln of the expanded the source and drain region 421 and the length Ln of the expanded the source region 43.

As shown in FIG. 13A, it is difficult to implant p-type impurity ions into parts of the SOI layer 2, on which a select gate transistor STS1 is formed, the length of which is denoted by Lp. By contrast, according to the second modification, ions are implanted in a self-aligned manner with the second polysilicon layer 15x as a mask, and a thermal treatment is performed, as shown in FIG. 27. Hence, a measurement margin equal to the length 2Ln can be achieved while a channel length Lp of a p channel region is formed, and a p channel region 42 underneath the select gate electrodes 13a and 15a can be easily formed.

Note that it is possible to form p channel region 44 underneath the select gate electrode 13b, 15b of the select gate transistors SGD1 shown in FIG. 1 easily in the same way. Since other steps are substantially the same as the steps shown in FIGS. 12A to 23B, repeated explanation is omitted.

(Third Modification)

Figure 28:
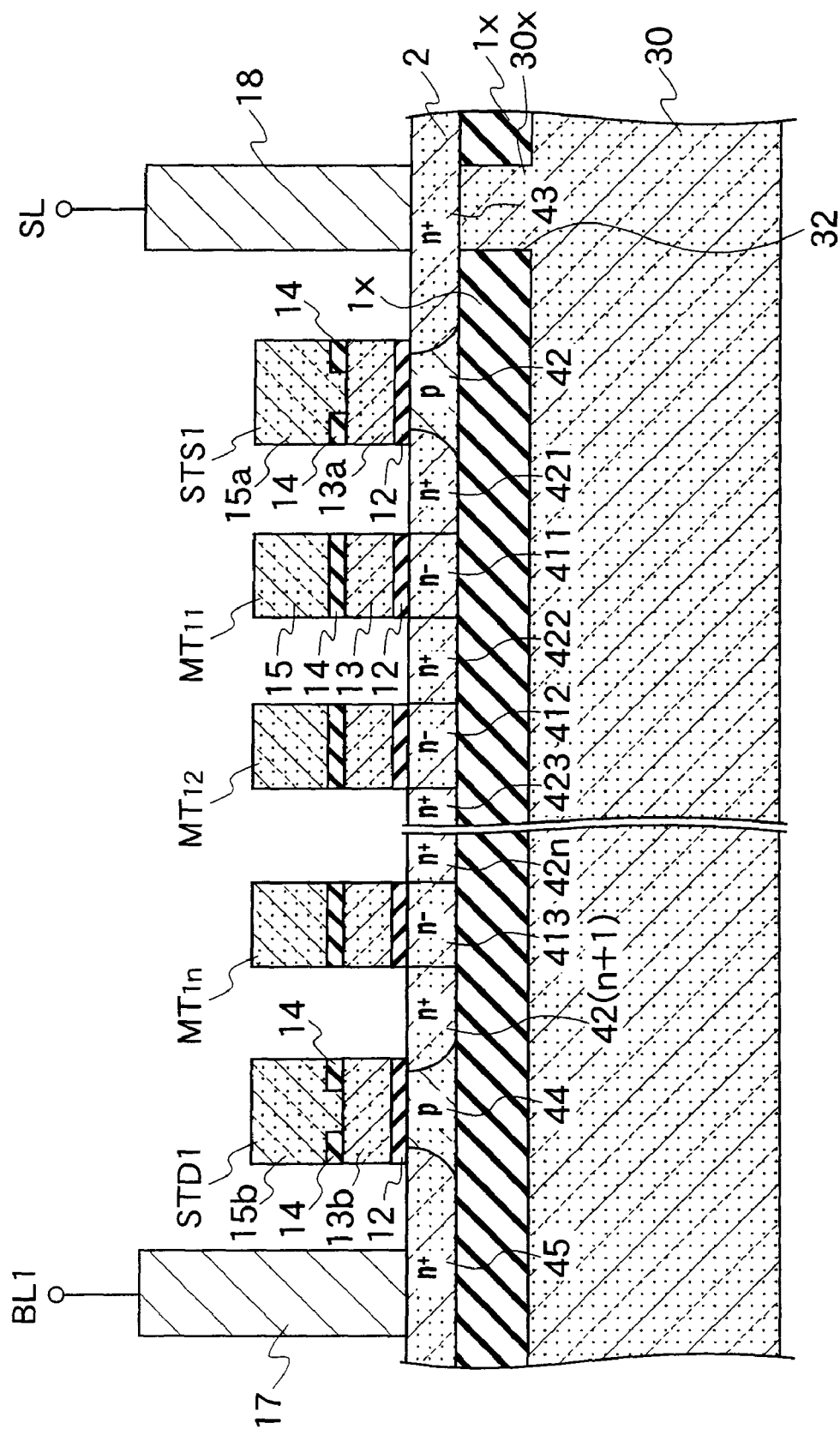
FIG. 28 is a cross-sectional view in the column direction showing an example of a cell array of a non-volatile semiconductor memory according to a third modification of the present invention.

A non-volatile semiconductor memory according to a third modification is different from the non-volatile semiconductor memory shown in FIG. 1 in that a semiconductor substrate 30 is arranged under an SOI insulator 1x as shown in FIG. 28. A convex cell array portion 30x is provided in the semiconductor substrate 30, and is connected with a source region 43 through a first opening portion 32 provided in the SOI insulator 1x. A source line contact 18 is arranged over the convex cell array portion 30x with the source region 43 interposed between the source line contact 18 and the convex cell array portion 30x.

Figure 29:
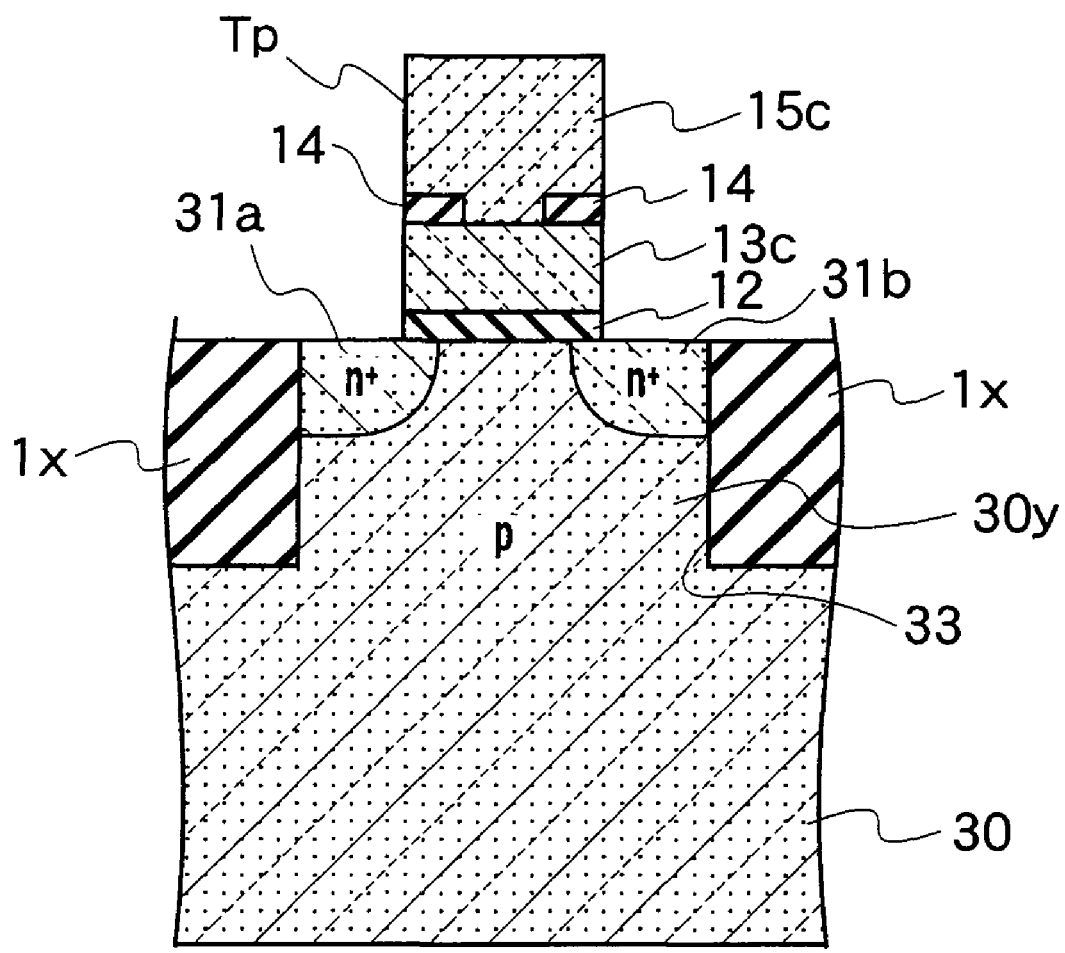
FIG. 29 is a cross-sectional view showing an example of a peripheral circuit in the non-volatile semiconductor memory according to the third modification of the present invention.

As shown in FIG. 29, a peripheral circuit (MIS transistor) Tp is arranged in the outer periphery of the cell array. The peripheral circuit Tp is formed by using as an active layer a peripheral convex portion 30y of the semiconductor substrate 30 in contact with the peripheral circuit, through a second opening portion 33 provided in the SOI insulator 1x. Impurity diffusion layers 31a and 31b are provided in the peripheral convex portion 30y of the semiconductor substrate 30. Gate electrodes 13c and 15c are arranged over a channel region between the impurity diffusion layers 31a and 31b with a gate insulating film 12 interposed between the gate electrode 13c and the channel region. The peripheral circuit Tp is isolated from an adjacent element, illustration is omitted, by the SOI insulator 1x. According to the third modification, the peripheral circuit Tp can be arranged, as it is, on the present semiconductor substrate 30, instead of being formed on the SOI insulator 1 employing the SOI technology.

Figure 30A:
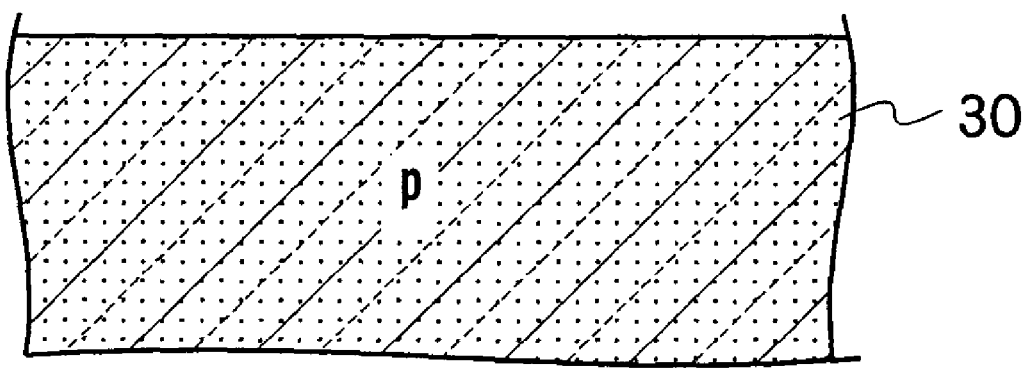
FIG. 30A is a cross-sectional view showing an example of method for fabricating a cell array of a non-volatile semiconductor memory according to the third modification of the present invention.
Figure 30B:
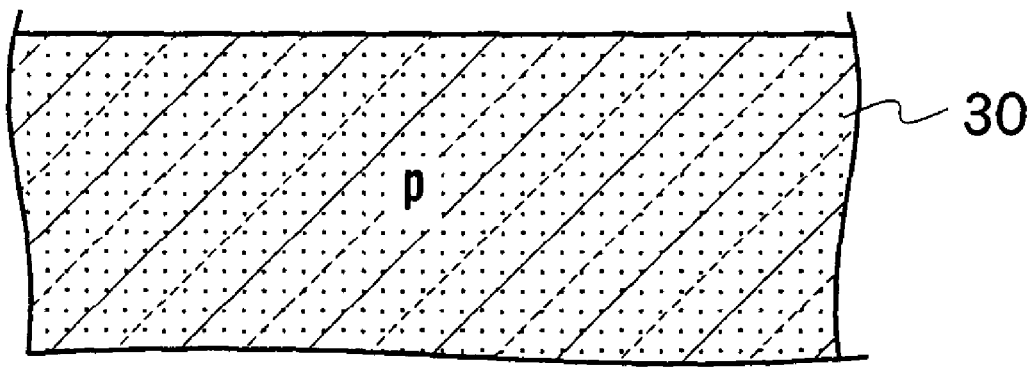
FIG. 30B is a cross-sectional view showing a method for fabricating a peripheral circuit of the non-volatile semiconductor memory according to the third modification of the present invention.
Figure 31A:
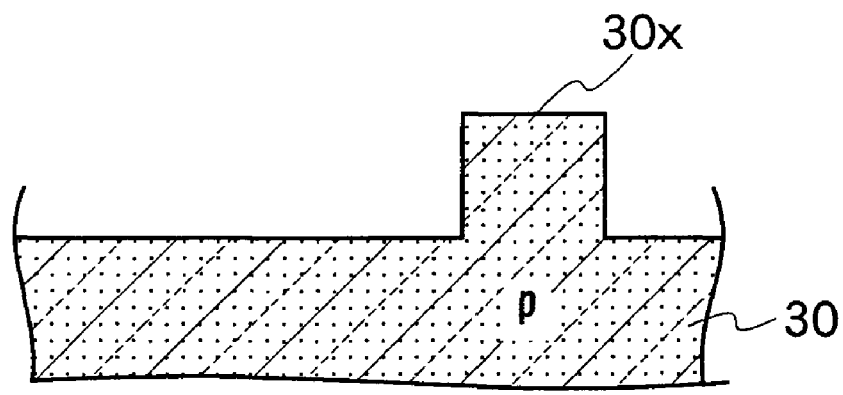
FIG. 31A. is a cross-sectional view after the process of FIG. 30A showing the method for fabricating the cell array of the non-volatile semiconductor memory according to the third modification of the present invention.
Figure 31B:
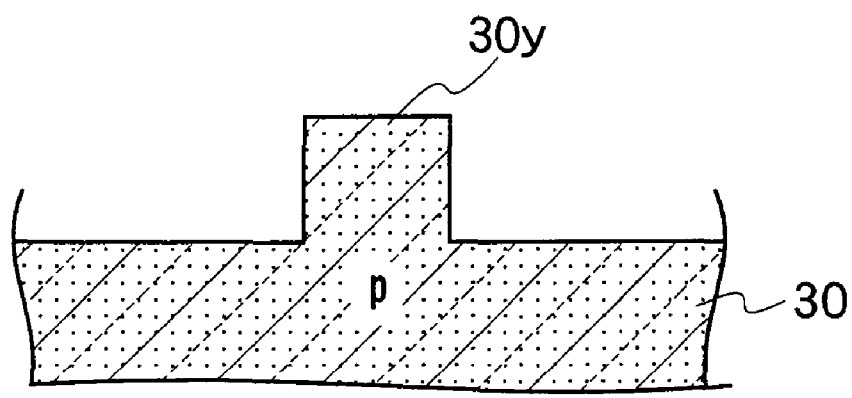
FIG. 31B is a cross-sectional view after the process of FIG. 30B showing the method for fabricating the peripheral circuit of the non-volatile semiconductor memory according to the third modification of the present invention.

Next, a description will be provided for a method for fabricating a non-volatile semiconductor memory according to the third modification shown in FIGS. 28 and 29, along with the cell array portion shown in FIGS. 30A, 31A, . . . , 34A and the peripheral circuit portion shown in FIGS. 30B, 31B, . . . , 34B.

As shown in FIGS. 30A and 30B, the semiconductor substrate 30 is prepared. A resist film is coated on the semiconductor substrate 30, and the resist film is patterned by the lithographic technique. With the patterned resist film used as a mask, parts of the semiconductor substrate 30 are removed in a selective manner by RIE or the like. As a result, the convex cell array portion 30x and the peripheral convex portion 30y, which are at substantially the same horizontal level, are formed as shown in FIG. 28.

Figure 32A:
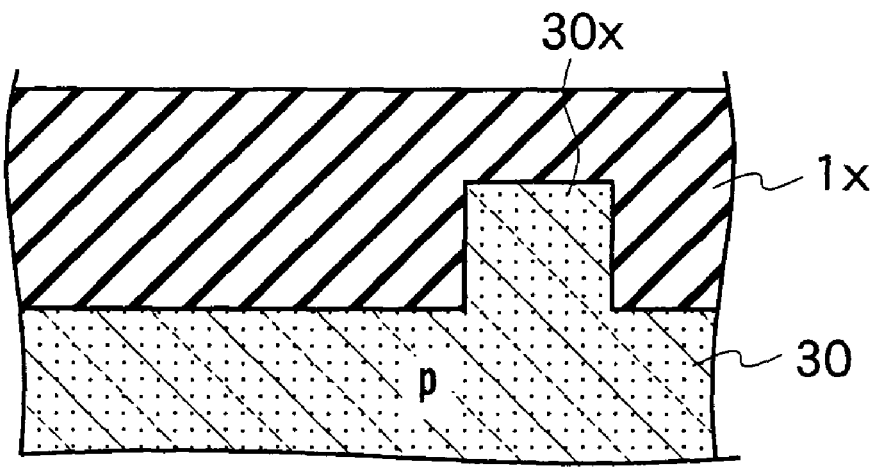
FIG. 32A is a cross-sectional view after view FIG. 31A showing the method for fabricating the cell array of the non-volatile semiconductor memory according to the third modification of the present invention.
Figure 32B:
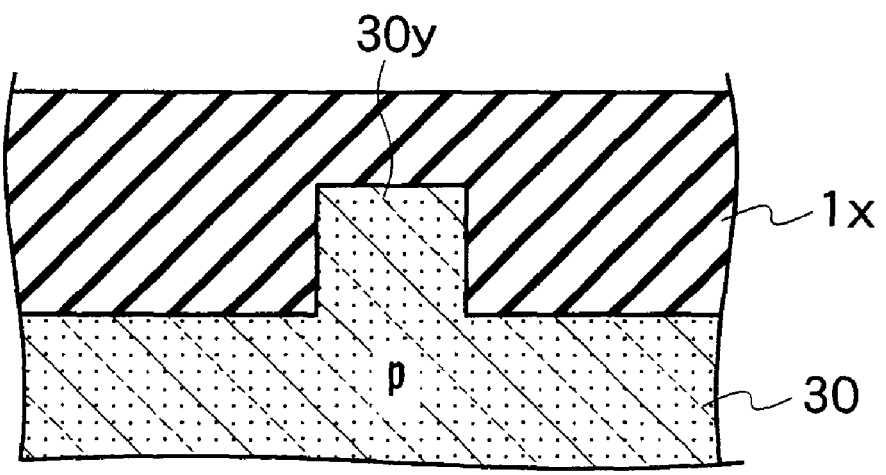
FIG. 32B. is a cross-sectional view after the process of FIG. 31B showing the method for fabricating the peripheral circuit of the non-volatile semiconductor memory according to the third modification of the present invention.

By CVD or the like, the SOI insulator 1x is deposited on the semiconductor substrate 30, as shown in FIG. 32A and FIG. 32B. As shown in 33A and 33B, the SOI insulator 1x is etched back and planarized by CMP and the like, until the convex cell array portion 30x and the peripheral convex portion 30y are exposed.

Figure 34A:
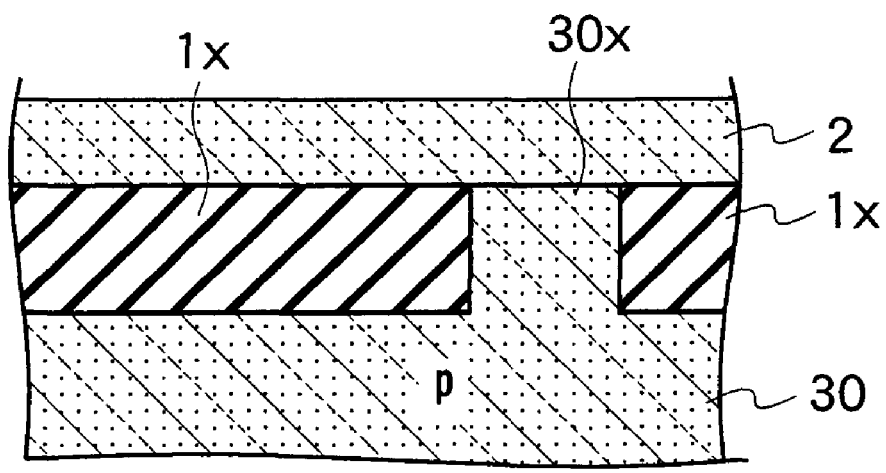
FIG. 34A is a cross-sectional view after view FIG. 33A showing the method for fabricating the cell array of the non-volatile semiconductor memory according to the third modification of the present invention.
Figure 34B:
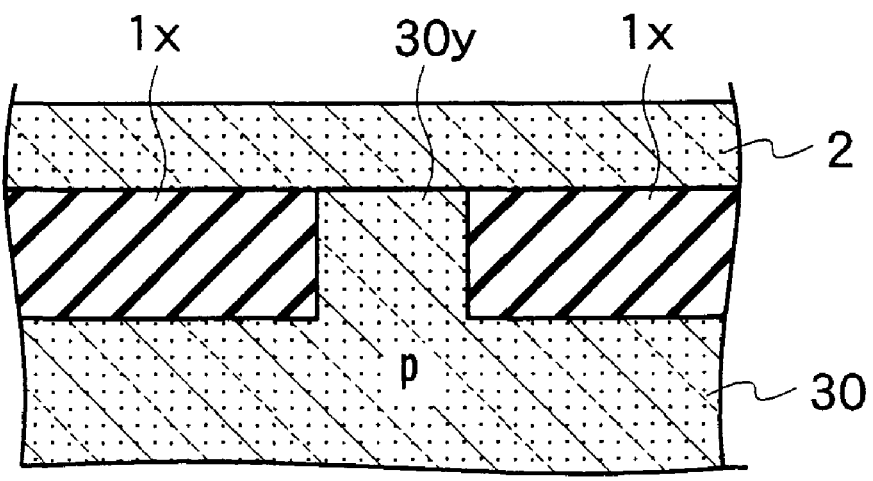
FIG. 34B is a cross-sectional view after the process of FIG. 33B showing the method for fabricating the peripheral circuit of the non-volatile semiconductor memory according to the third modification of the present invention.

As shown in FIGS. 34A and 34B, the SOI layer 2 is deposited on the SOI insulator 1x by CVD and the like. As shown in FIG. 28, the source line contact 18 is formed over the convex cell array portion 30x of the semiconductor substrate 30 with the SOI layer 2 interposed between the source line contact 18 and the convex cell array portion 30x. Moreover, as shown in FIG. 29, the peripheral circuit Tp is formed in the peripheral convex portion 30y of the semiconductor substrate 30. The other steps are substantially the same as the series of steps shown in FIG. 13A to FIG. 23B. For this reason, a description will be omitted for the common steps.

Figure 33A:
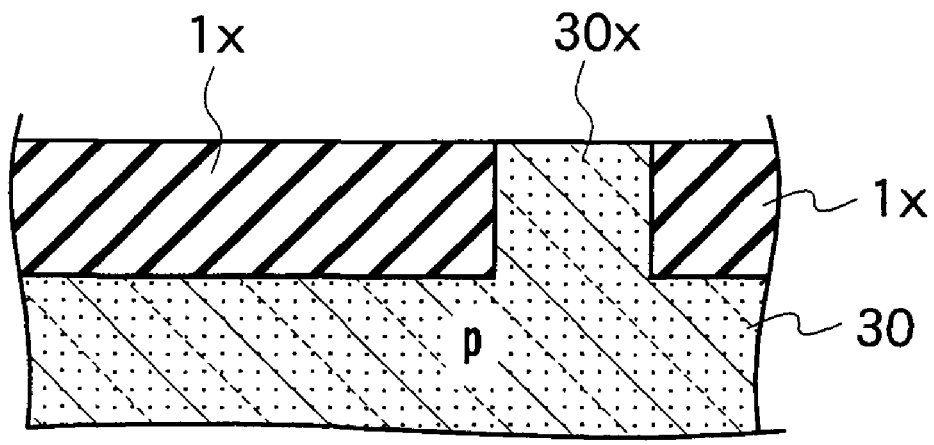
FIG. 33A is a cross-sectional view after view FIG. 32A showing the method for fabricating the cell array of the non-volatile semiconductor memory according to the third modification of the present invention.
Figure 33B:
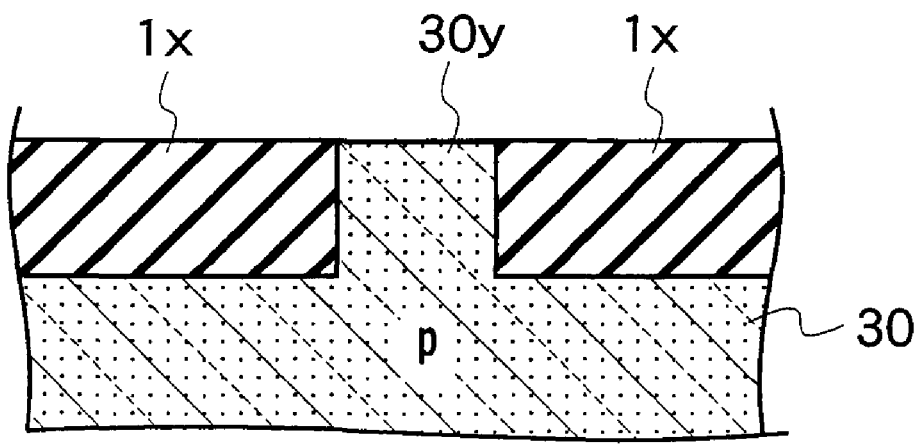
FIG. 33B is a cross-sectional view after the process of FIG. 32B showing the method for fabricating the peripheral circuit of the non-volatile semiconductor memory according to the third modification of the present invention.

When the CMP shown in FIGS. 33A and 33B is performed, if there is a planar surface which is larger than a certain area, it is difficult to control the flatness during the CMP. According to the third modification, it is easy to control the flatness by CMP, since the convex cell array portion 30x is exposed in parts of the planar SOI insulator 1x as shown in FIG. 33A in the cell array section.

Figure 35:
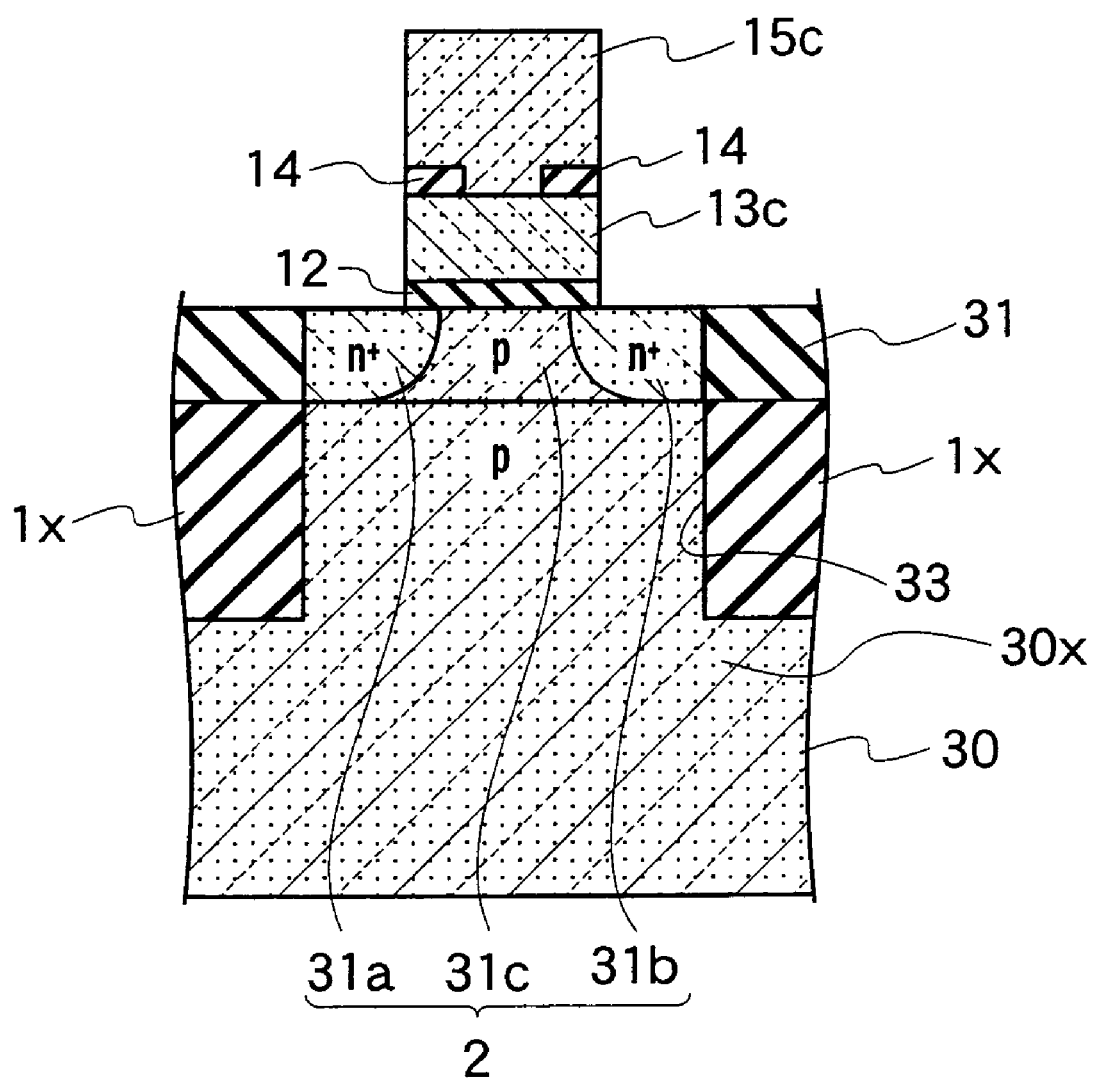
FIG. 35 is a cross-sectional view showing another example of a peripheral circuit in a non-volatile semiconductor memory according to the third modification of the present invention.

The peripheral circuit Tpx may be arranged in the SOI layer 2 on the semiconductor substrate 30, as shown in FIG. 35. An element of the peripheral circuit Tpx is isolated by an element isolation region (STI) 31 from an element, illustration omitted, and which is adjacent the element of the peripheral circuit Tpx. The peripheral circuit Tpx can be provided by selectively removing parts of the SOI layer 2 and by embedding the element isolation region (STI) 31.

(Fourth Modification)

Figure 36:
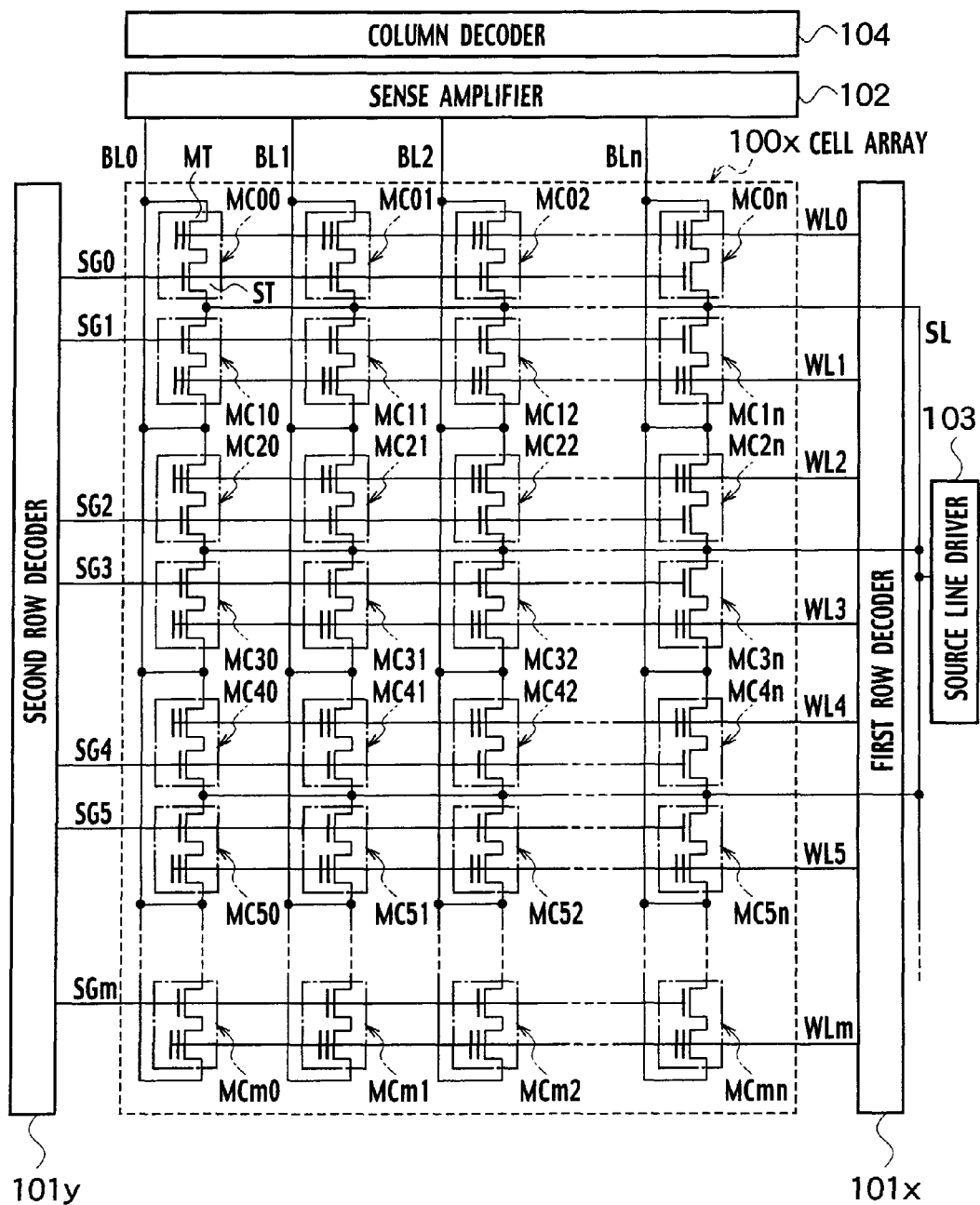
FIG. 36 is a circuit diagram showing an example of a two-transistor type cell array in a non-volatile semiconductor memory according to the fourth modification of the present invention.

As shown in FIG. 36, a non-volatile semiconductor memory according to a fourth modification of the present invention may have a two-transistor cell structure which is an expansion of a planar pattern structure of a one-transistor cell structure shown in FIG. 2. The non-volatile semiconductor memory shown in FIG. 36 comprises a cell array 100x, a column decoder 104, a sense amplifier 102, a first row decoder 101x, a second row decoder 101y and a source line driver 103.

The cell array 100x comprises a plurality ((m+1)×(n+1); m and n are integers) of memory cells $MC_{00}$ to $MC_{mn}$. Each of the memory cells MC includes a memory cell transistor MT and a select transistor ST. In each of the cell transistor and the select transistor a current pathway is connected in series. The memory cell transistor MT comprises a stacked gate structure including: a floating gate electrode formed above a semiconductor substrate with a gate insulating film interposed between the floating gate electrode and the semiconductor substrate; and a control gate electrode formed above the floating gate electrode with an inter-electrode insulating film interposed between the control gate electrode and the floating gate electrode. A source region of the memory cell transistor MT is connected to a drain region of the select transistor ST. Each of two memory cells MC adjacent to each other in the column direction share the source region of the select transistor ST or the drain region of the memory cell transistor MT.

The control gate electrodes of the respective memory cell transistors MT of the respective memory cells MC in the same row are commonly connected to one of word lines WL0 to WLm. The gates of the respective select transistors ST of the respective memory cells in the same row are connected to any one of select gate lines SG0 to SGm. The drain regions of the respective memory cell transistors MT of the respective memory cells MC in the same row are commonly connected to one of bit lines BL0 to BLn. The sources of the respective select transistors ST of the respective memory cells MC are commonly connected to a source line SL, and the source line SL is connected to a source line driver 103.

The column decoder 104 decodes a column address signal, thereby obtaining a column address decoded signal. One of the bit lines BL0 to BLn is selected on a basis of the column address decoded signal. The first and second row decoders 101x and 101y decode a row address signal, thereby obtaining a row address decoded signal. The first row decoder 101x selects one of the word lines WL0 to WLn when writing is initiated. The second row decoder 101y selects one of the select gate lines SG0 to SGm when reading is initiated. The sense amplifier 102 amplifies data which have been read out from a memory cell selected by the second row decoder 101y and the column decoder 104. The source line driver 103 supplies voltage to the source line SL during reading.

According to the fourth modification, the non-volatile semiconductor memory is designed to comprise the two-transistor cell structure, so that the memory cell MC is positively cut off, and thus enabling a readers operation to be performed. In addition, a three-transistor cell structure in which a select transistor ST is connected to both a source region and a drain region for each of the memory cell transistors MT can be easily expanded from the planar pattern shown in FIG. 2.

(Fifth Modification)

Figure 37:
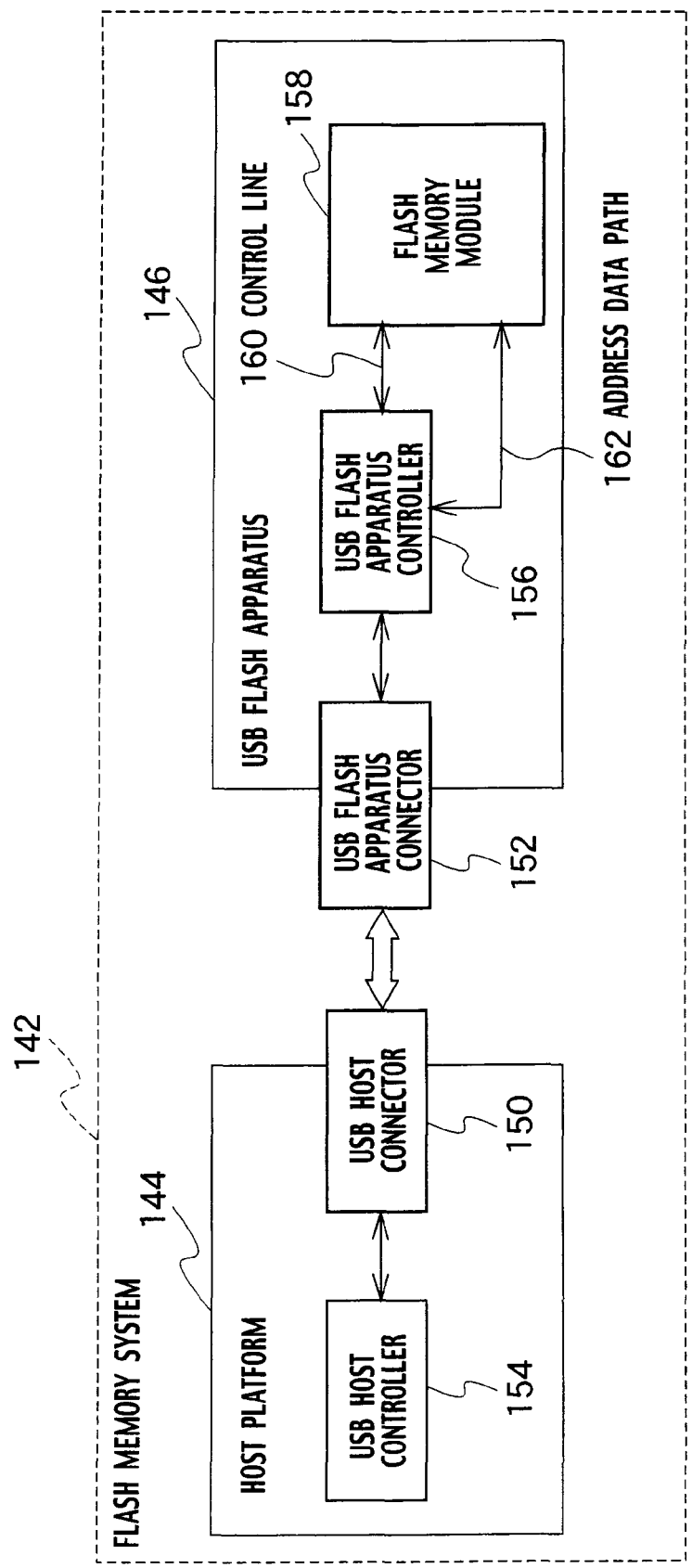
FIG. 37 is a block diagram showing an example of a flash memory system using a non-volatile semiconductor memory according to the fifth modification of the present invention.

As a fifth modification of the present invention, a description will be provided for a flash memory system 142, which is an applied example of the non-volatile semiconductor memory shown in FIG. 1, with reference to FIG. 37. The flash memory system 142 comprises a host platform 144 and a universal serial bus (USB) flash device 146. The host platform 144 is connected to the USB flash device 146 through a USB cable 148. The host platform 144 is connected to the USB cable 148 through a USB host connector 150, and the USB flash device 146 is connected to the USB cable 148 through a USB flash device connector 152. The host platform 144 comprises a USB host controller 154 for controlling packet transfer on the USB.

The USB flash device 146 includes: a USB flash device controller 156 for controlling other elements in the USB flash device 146, and for controlling an interface to the USB bus of the USB flash device 146; a USB flash device connector 152; and at least one flash memory module 158 including a non-volatile semiconductor memory according to an embodiment of the present invention.

Once the USB flash device 146 is connected to the host platform 144, a standard USB listing process is started. At this point, the hot platform 114 recognizes the USB flash device 146, and selects a mode of communications with the USB flash device 146. Then, the host platform 114 transmits data to, and receives data from, the USB flash device 146 through an FIFO buffer, termed as an endpoint, for storing transmitted data. The host platform 144 recognizes changes in physical, electrical conditions such as disconnection and connection of the USB flash device 146 and the like through the endpoint. In addition, if there is a packet to be received, the host platform 144 receives it.

The host platform 144 requests a service from the USB flash device 146 by transmitting a request packet to the USB host controller 154. The USB host controller 154 transmits a packet on the USB cable 148. If the USB flash device 146 has an endpoint which receives this request packet, the requests are received by the USB flash device controller 156.

The USB flash device controller 156 performs various operations such as reading data from the flash memory module 158, writing data to the flash memory module 158, erasing data and the like. In addition, the USB flash device controller 156 supports basic USB functions such as the acquisition of a USB address and the like. The USB flash device controller 156 controls the flash memory module 158 through a control line 160 for controlling output from the flash memory module 158, or, for example, through a read/write signal and various other signals such as a chip enable signal and the like. The flash memory module 158 is also connected to the USB flash device controller 156 through an address data bus 162. The address data bus 12 transfers a read command, a write command and an erase command as well as an address and data in the flash memory module 158.

In order to inform the host platform 144 of a result and the state of various operations requested by the host platform 144, the USB flash device 146 transmits a state packet by use of a state endpoint (endpoint 0). At this point, the host platform 144 checks whether or not there is a state packet, and the SB flash device 146 returns an empty packet or the state packet if there is no new packet of a state message.

According to the fifth modification, various functions of the USB flash device 146 can be achieved. By eliminating the USB cable 148, the connectors may be connected directly.

(Sixth Modification)

Figure 38:
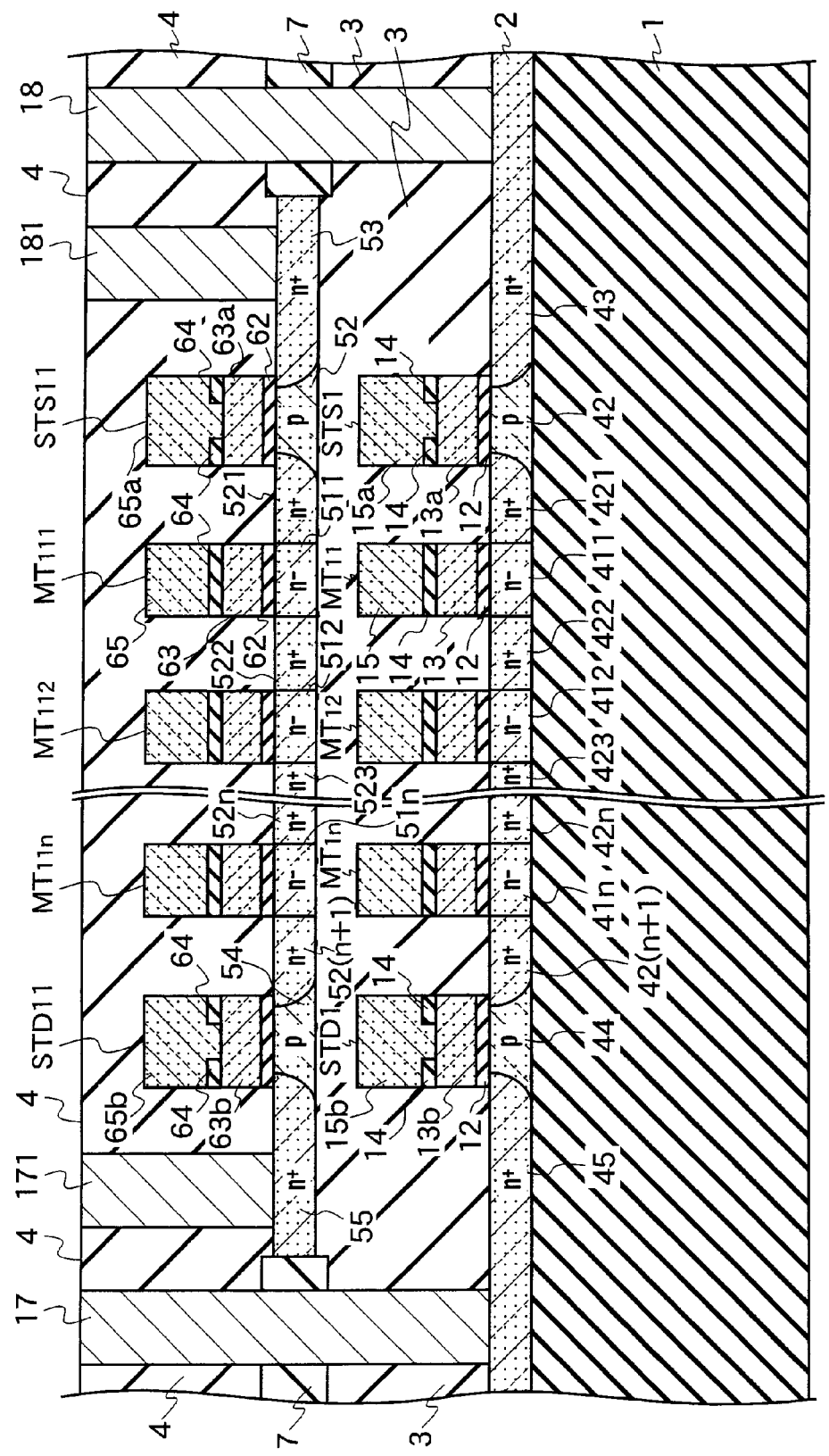
FIG. 38 is a cross-sectional view in the column direction showing an example of a non-volatile semiconductor memory according to the sixth modification of the present invention.
Figure 39:
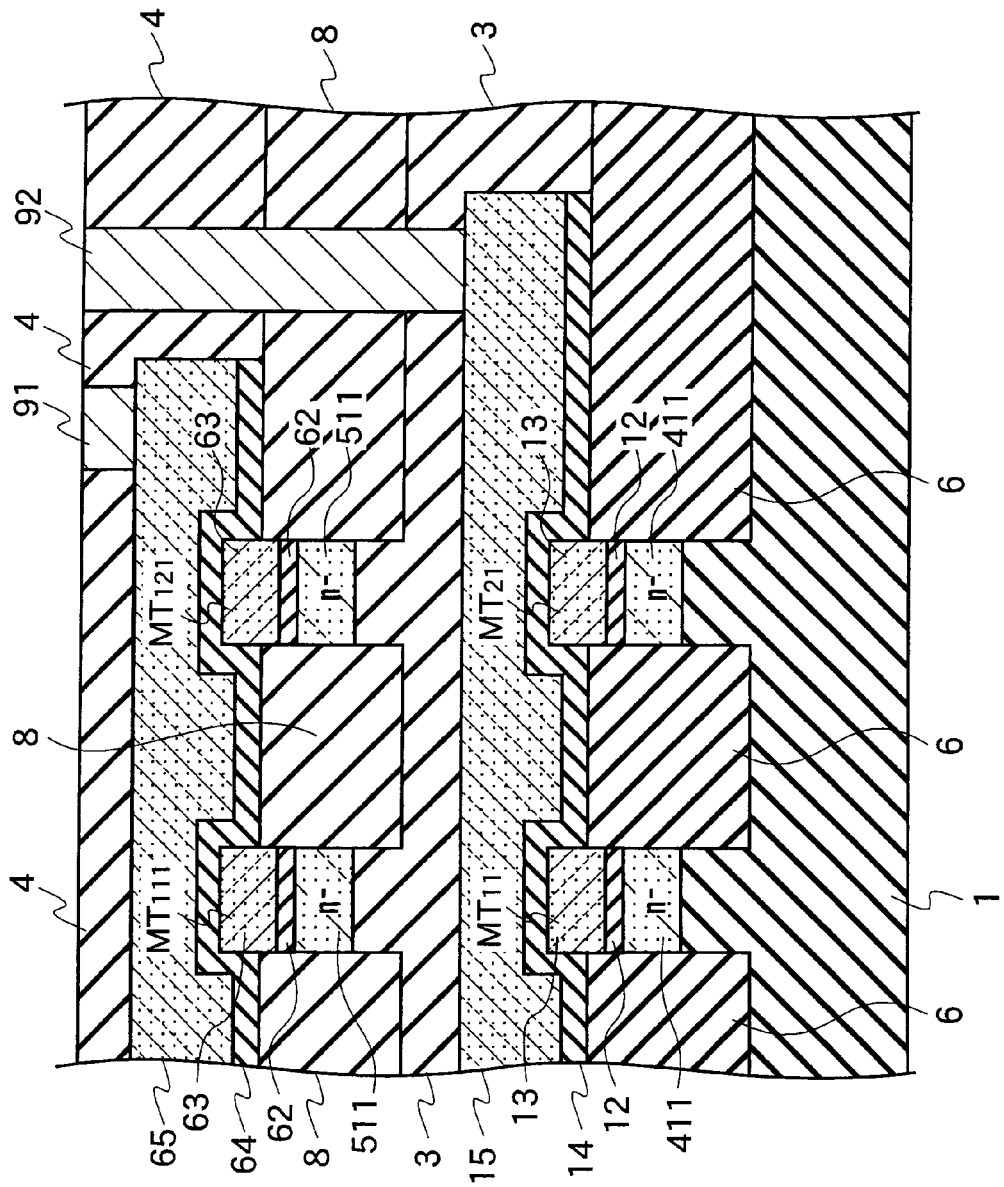
FIG. 39 is a cross-sectional view in the row direction showing an example of a non-volatile semiconductor memory according to the sixth modification of the present invention.

As show in FIG. 38 and FIG. 39, a non-volatile semiconductor memory according to a sixth modification of the present invention is three-dimensionally integrated by stacking SOI structures. The inter-layer dielectric 3 is disposed on elements such as the memory cell transistors $MT_{11}$ to $MT_{1n}$, the select gate transistors STD1 and STS1, and the like. The inter-layer dielectric 3 is used for insulation material of an upper layer of the SOI structure. Memory cell transistors $MT_{111}$ to $MT_{11n}$ are depletion mode MIS transistors including: $n^+$ source and drain regions 521 to 52 (n+1) which are arranged on the inter-layer dielectric (SOI insulator) 3, and which are opposite to each other; $n^-$ channel regions 511 to 51n, each of which is interposed between each adjacent pair of the source and drain regions 521 to 52(n+1), and whose impurity concentrations are lower than those of the source and drain regions 521 to 52(n+1); floating gate electrodes 63 which are insulated, and each of which is arranged above each of the channel regions 511 to 51n; and control gate electrodes 65 which are insulated, each of which is arranged above each of the floating gate electrodes 63.

Each of two select gate transistors STS11 and STD11 is arranged in, and adjacent to, each end of the column direction of the memory cell transistors $MT_{111}$ to $MT_{11n}$. The select gate transistor STS11 is an enhancement MIS transistor including: an $n^+$ drain region 521 which is a region common a source region 521 of the memory cell transistor $MT_{111}$ positioned at one end of the arrangement in the column direction; p channel region 52 arranged so as to be adjacent to the drain region 521; an $n^+$ source region 53 arranged so as to be adjacent to the channel region 52; select gate electrodes 63a and 65a arranged above the channel region 52 with the gate insulating film 62 interposed between the channel region 52 and the set of select gate electrodes 63a and 65a.

Alternatively, the select gate transistor STD11 is an enhancement MIS transistor including: an $n^+$ source region 52(n+1) which is common a drain region 52(n+1) of the memory cell transistor $MT_{11n}$ positioned at another end of the arrangement in the column direction; a p channel region 54 arranged so as to be adjacent to the source region 52(n+1); an $n^+$ drain region 55 arranged so as to be adjacent to the channel region 54; select gate electrodes 63b and 65b arranged above the channel region 54 with the gate insulating film 62 interposed between the channel region 54 and the set of select gate electrodes 63b and 65b.

A bit line contact 171 is arranged on the drain region 55 so that the bit line contact 171 is adjacent to the select gate transistor STD11. A source line contact 181 is arranged on the source region 53 so that the source line contact 181 is adjacent to the select gate transistor STS11. The bit line contact 171 and the source line contact 181 are insulated at the periphery by the inter-layer dielectric 3, the insulating film 7 on the inter-layer dielectric 3, and the inter-layer dielectric 4 on the insulating film 7.

As shown in FIG. 39, the word line contacts 91 and 92, which are different from each other, are disposed in upper and lower layers, respectively. The element isolation region 8 isolates the memory cell transistors $MT_{111}$ and $MT_{121}$. An element insulation region 4 is disposed on elements such as the memory cell transistors $MT_{111}$ to $MT_{11n}$ and the select gate transistors STS11 and STD11, and the like.

Figure 40:
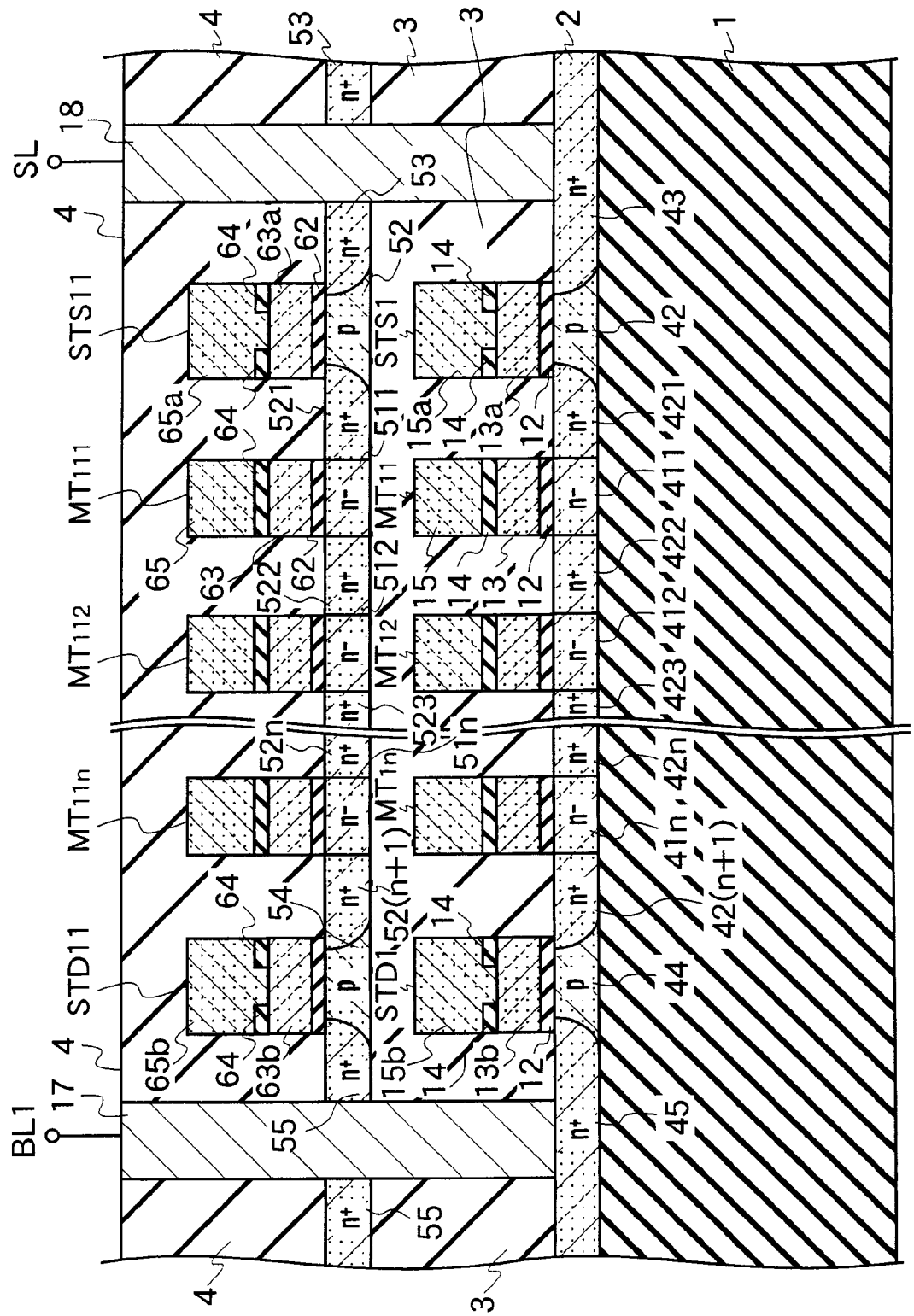
FIG. 40 is a cross-sectional view showing another example of a non-volatile semiconductor memory according to the sixth modification of the present invention.

According to the sixth embodiment of the present invention, it is possible to integrate three-dimensionally by stacking SOI structures. Note that as shown in FIG. 40, the bit line contact 17 and the source line contact 18 may be commonly disposed from the lower layer to the upper layer. In this case, as shown in FIG. 39, the word line contacts 91 and 92 are disposed in the upper layer and lower layer, respectively. Furthermore, the memory cell transistors $MT_{111}$ to $MT_{11n}$ are described as depletion transistors, however the memory cell transistors $MT_{111}$ to $MT_{11n}$ may be enhancement transistors. The structure is described in which two layers of SOI structures are stacked, SOI structure having a plurality of layers, which may be more than three layers, may be provided.

In the method for fabricating the non-volatile semiconductor memory according to the sixth embodiment of the present invention, after forming the memory cell transistors $MT_{11}$ to $MT_{11}$ and the select gate transistors STD1 and STS1, the inter-layer dielectric 3 is formed by CVD or the like in order to cover the memory cell transistors $MT_{11}$ to $MT_{1n}$ and the select gate transistors STD1 and STS1. Thereafter, the same procedure as other modifications may be used for forming the memory cell transistors $MT_{11}$ to $MT_{1n}$ and the select gate transistors STD1 and STS1, the memory cell transistors $MT_{111}$ to $MT_{1n}$ and the select gate transistors STD11 and STS11 on the inter-layer dielectric 3.

(Other Embodiments)

In the embodiment, m×n memory cell transistors $MT_{11}$ to $MT_{1n}$, $MT_{21}$ to $MT_{2n}$, ..., $MT_{m1}$ to $MT_{mn}$ are explained. However, actually a cell array may be comprised by more plurality of memory cell transistors, memory cells and blocks.

Furthermore, in the embodiment, a biary NAND EEPROM is described. However, it is possible to adapt a multi-level storage, for example, three-level or more storage in the NAND EEPROM. Various modifications will become possible for those skilled in the art after receiving the teachings of the present disclosure without departing from the scope thereof.

What is claimed is:

1. A non-volatile semiconductor memory comprising memory cell transistors comprising:
   a first source and a first drain regions having a first conductivity type disposed on an insulating layer;
   a first channel region having the first conductivity type touched on the insulating layer and interposed between the first source and first drain regions;
   a floating gate electrode disposed above the first channel region and insulated from the first channel region;
   a control gate electrode disposed above the floating gate electrode and insulated from the floating electrode, and
   an enhancement mode select gate transistor connected to the source region of one of the memory cell transistors at one end of an array of the memory cell transistors arranged in a column direction of a matrix, the enhancement mode select gate transistor comprising:
      a second source and a second drain regions having the first conductivity type disposed on the insulating layer;
      a second channel region having a second conductivity type between the second drain region and the second source region, and
      a select gate electrode disposed above the second channel region and insulated from the second channel region,
   wherein a part of the semiconductor substrate comprises a cell array convex portion which is same material as the semiconductor substrate contacts with a bottom of the first drain region or the second drain region through an opening disposed in the insulating layer.

2. The non-volatile semiconductor memory of claim 1, wherein the first channel region in each of the memory cell transistors has a lower impurity concentration than the first source and first drain regions in each of the memory cell transistors.

3. The non-volatile semiconductor memory of claim 1, wherein the first source and first drain regions in each of the memory cell transistors are touched on the insulating layer.

4. The non-volatile semiconductor memory of claim 1, wherein a plurality of the first source regions, the first channel regions and the first drain regions are extended in the column direction so as to implement an array of memory cell transistors, sharing each of the first drain regions with one of the first source regions in a pair of the memory cell transistors adjacent to each other in the array, and the first source regions, the first channel regions and the first drain regions arranged in a subject column are isolated respectively from the first source regions, the first channel regions and the first drain regions of the memory cell transistors arranged in a column adjacent to the subject column.

5. A non-volatile semiconductor memory comprising an array of first memory cell transistors, an inter-layer dielectric provided on the array of the first memory cell transistors, and an array of second memory cell transistors provided on the inter-layer dielectric, each of the first memory cell transistors comprising:
   a first source and drain regions having a first conductivity type disposed on an insulating layer;
   a first channel region having the first conductivity type touched on the insulating layer and interposed between the first source and drain regions;
   a first floating gate electrode disposed above the first channel region and insulated from the first channel region; and
   a first control gate electrode disposed above the first floating gate electrode and insulated from the first floating electrode,
   wherein each of the second memory cell transistors comprises:
      a second source and drain regions having the first conductivity type disposed on the inter-layer dielectric;
      a second channel region having the first conductivity type touched on the inter-layer dielectric and interposed between the second source and drain regions;
      a second floating gate electrode disposed above the second channel region and insulated from the second channel region; and
      a second control gate electrode disposed above the second floating gate electrode and insulated from the second floating electrode.

6. The non-volatile semiconductor memory of claim 5, wherein each of the first channel regions of the first memory cell transistors has a lower impurity concentration than the corresponding first source and drain regions of the first memory cell transistors, and each of the second channel region of the second memory cell transistors has a lower impurity concentration than the corresponding second source and drain regions of the second memory cell transistors.

7. The non-volatile semiconductor memory of claim 5, wherein the first source and drain regions in each of the first memory cell transistors are touched on the insulating layer, and the second source and drain regions in each of the second memory cell transistors are touched on the inter-layer dielectric.

8. The non-volatile semiconductor memory of claim 5, further comprising a plurality of contacts connected to the first source region, the first drain region, the second source region and the second drain region, respectively.

9. The non-volatile semiconductor memory of claim 8, the plurality of contacts comprise:
   a first source line contact connected to one of the first source regions;
   a second source line contact connected to one of the second source regions;
   a first bit line contact connected to one of the first drain regions; and
   a second bit line contact connected to one of the second drain regions.

10. The non-volatile semiconductor memory of claim 8, wherein the plurality of contacts comprise:
    a source line contact connected to one of the first source regions and one of the second source regions; and
    a bit line contact connected to one of the first drain regions and one of the second drain regions.

11. A non-volatile semiconductor memory comprising an array of first memory cell transistors, an inter-layer dielectric provided on the array of the first memory cell transistors, and an array of second memory cell transistors provided on the inter-layer dielectric, each of the first memory cell transistors comprising:

a first source and drain regions having a first conductivity type disposed on an insulating layer;

a first channel region having the first conductivity type touched on the insulating layer and interposed between the first source and drain regions;

a first floating gate electrode disposed above the first channel region and insulated from the first channel region; and a first control gate electrode disposed above the first floating gate electrode and insulated from the first floating electrode;

wherein each of the second memory cell transistors comprises:

a second source and drain regions having the first conductivity type disposed on the inter-layer dielectric;

a second channel region having the first conductivity type touched on the inter-layer dielectric and interposed between the second source and drain regions;

a second floating gate electrode disposed above the second channel region and insulated from the second channel region; and a second control gate electrode disposed above the second floating gate electrode and insulated from the second floating electrode, wherein a plurality of the first source regions, the first channel regions and the first drain regions are extended in a column direction on a first matrix so as to implement the array of the first memory cell transistors, sharing each of the first drain regions with one of the first source regions being assigned to an adjacent first memory cell transistors in the array of the first memory cell transistors, such that the first source regions, the first channel regions and the first drain regions of the first memory cell transistors arranged in a subject column are isolated respectively from the first source regions, the first channel regions and the first drain regions of the first memory cell transistors arranged in a column adjacent to the subject column, wherein a plurality of the second source regions, the second channel regions and the second drain regions are extended in the column direction on a second matrix so as to implement the array of the second memory cell transistors, sharing each of the second drain regions with one of the second source regions being assigned to an adjacent second memory cell transistors in the array of the second memory cell transistors, such that the second source regions, the second channel regions and the second drain regions of the second memory cell transistors arranged in a subject column are isolated respectively from the second source regions, the second channel regions and the second drain regions of the second memory cell transistors arranged in a column adjacent to the subject column;

a first enhancement mode select gate transistor connected to the first source region of one of the first memory cell transistors at one end of the array of the first memory cell transistors arranged in the column direction of the first matrix; and a second enhancement mode select gate transistor connected to the second source region of one of the second memory cell transistors at one end of the array of the second memory cell transistors arranged in the column direction of the second matrix, wherein the first enhancement mode select gate transistor comprises, a third source region having the first conductivity type and being common to the first drain region of one of the first memory cell transistors at one end of the first memory cell transistors arranged in the column direction of the first matrix, a third channel region having a second conductivity type adjacent to the third source region, a third drain region having the first conductivity type adjacent to the third channel region, and a select gate electrode disposed above the third channel region and insulated from the third channel region;

wherein the second enhancement mode select gate transistor comprises, a fourth source region having the first conductivity type and being common to the second drain region of one of the second memory cell transistors at one end of the second memory cell transistors arranged in the column direction of the second matrix, a fourth channel region having the second conductivity type adjacent to the fourth source region, a fourth drain region having the first conductivity type adjacent to the fourth channel region; and a second select gate electrode disposed above the fourth channel region and insulated from the fourth channel region; and a part of the semiconductor substrate comprises a cell array convex portion which is same material as the semiconductor substrate contacts with a bottom of the third drain region or the fourth drain region through an opening disposed in the insulating layer.

12. The non-volatile semiconductor memory of claim 11, wherein each of the first channel regions of the first memory cell transistors has a lower impurity concentration than the corresponding first source and drain regions of the first memory cell transistors, and each of the second channel region of the second memory cell transistors has a lower impurity concentration than the corresponding second source and drain regions of the second memory cell transistors.

13. The non-volatile semiconductor memory of claim 11, wherein the first source and drain regions in each of the first memory cell transistors are touched on the insulating layer, and the second source and drain regions in each of the second memory cell transistors are touched on the inter-layer dielectric.

14. The non-volatile semiconductor memory of claim 11, further comprising a plurality of contacts connected to the third drain region and the fourth drain region, respectively.

15. The non-volatile semiconductor memory of claim 14, the plurality of contacts comprise:

a first source line contact connected to one of the first source regions;

a second source line contact connected to one of the second source regions;

a first bit line contact connected to one of the first drain regions; and a second bit line contact connected to one of the second drain regions.

16. The non-volatile semiconductor memory of claim 14, wherein the plurality of contacts comprise:

a source line contact connected to one of the first source regions and one of the second source regions; and a bit line contact connected to one of the first drain regions and one of the second drain regions.

* * * * *